(12) United States Patent
Shin et al.

(10) Patent No.: US 11,587,609 B2
(45) Date of Patent: Feb. 21, 2023

(54) MULTI-LEVEL SIGNAL RECEIVERS AND MEMORY SYSTEMS INCLUDING THE SAME

(71) Applicant: Samsung Electronics Co., Ltd., Suwon-si (KR)

(72) Inventors: Kwangseob Shin, Anyang-si (KR); Jaewoo Park, Yongin-si (KR); Younghoon Son, Yongin-si (KR); Youngdon Choi, Seoul (KR); Junghwan Choi, Hwaseong-si (KR)

(73) Assignee: Samsung Electronics Co., Ltd.

( * ) Notice: Subject to any disclaimer, the term of this patent is extended or adjusted under 35 U.S.C. 154(b) by 186 days.

(21) Appl. No.: 17/228,943

(22) Filed: Apr. 13, 2021

(65) Prior Publication Data

US 2022/0068359 A1  Mar. 3, 2022

(30) Foreign Application Priority Data

Sep. 2, 2020 (KR) .................. 10-2020-0111665

(51) Int. Cl.
| | | |
|---|---|---|
| *G11C 11/4093* | (2006.01) | |
| *G06F 13/16* | (2006.01) | |
| *G11C 11/4074* | (2006.01) | |
| *G11C 11/4076* | (2006.01) | |
| *G11C 11/4091* | (2006.01) | |
| *G11C 7/10* | (2006.01) | |
| *G11C 29/42* | (2006.01) | |
| *G11C 5/14* | (2006.01) | |
| *G11C 7/06* | (2006.01) | |
| *G11C 7/22* | (2006.01) | |
| *G11C 8/10* | (2006.01) | |
| *H04L 25/02* | (2006.01) | |

(52) U.S. Cl.
CPC ...... *G11C 11/4093* (2013.01); *G06F 13/1668* (2013.01); *G11C 11/4074* (2013.01); *G11C 11/4076* (2013.01); *G11C 11/4091* (2013.01)

(58) Field of Classification Search
CPC ............ G11C 11/4093; G11C 11/4091; G11C 11/4074; G11C 11/4076; G11C 7/1084; G06F 13/1668
USPC ........................................................ 710/105
See application file for complete search history.

(56) References Cited

U.S. PATENT DOCUMENTS 8,457,190 B2  6/2013  Raghavan et al.
8,879,616 B2  11/2014  Zhou et al.
(Continued)

*Primary Examiner* — Chun Kuan Lee
(74) *Attorney, Agent, or Firm* — Myers Bigel, P.A.

(57) ABSTRACT

A multi-level signal receiver includes a data sampler having (M−1) sense amplifiers therein, which are configured to compare a multi-level signal having one of M voltage levels with (M−1) reference voltages, to thereby generate (M−1) comparison signals. The data sampler is further configured to generate a target data signal including N bits, where M is an integer greater than two and N is an integer greater than one. An equalization controller is provided, which is configured to train the (M−1) sense amplifiers by: (i) adjusting at least one of (M−1) voltage intervals during a first training mode, and (ii) adjusting levels of the (M−1) reference voltages during a second training mode, based on equalized values of the (M−1) comparison signals, where each of the (M−1) voltage intervals represents a difference between two adjacent voltage levels from among the M voltage levels.

20 Claims, 23 Drawing Sheets

(56) References Cited

U.S. PATENT DOCUMENTS

| | | | |
|---|---|---|---|
| 9,973,356 B1* | 5/2018 | Livne | H04L 25/03057 |
| 10,038,575 B1 | 7/2018 | Steffan et al. | |
| 10,135,641 B1 | 11/2018 | Sedarat | |
| 10,164,805 B1* | 12/2018 | Hollis | H04L 25/03057 |
| 10,516,427 B2 | 12/2019 | Hossain et al. | |
| 10,523,471 B2 | 12/2019 | Vegas Olmos et al. | |
| 2009/0116596 A1* | 5/2009 | Oh | G11C 27/026 |
| | | | 375/354 |
| 2020/0066309 A1* | 2/2020 | Mayer | G11C 5/147 |

* cited by examiner

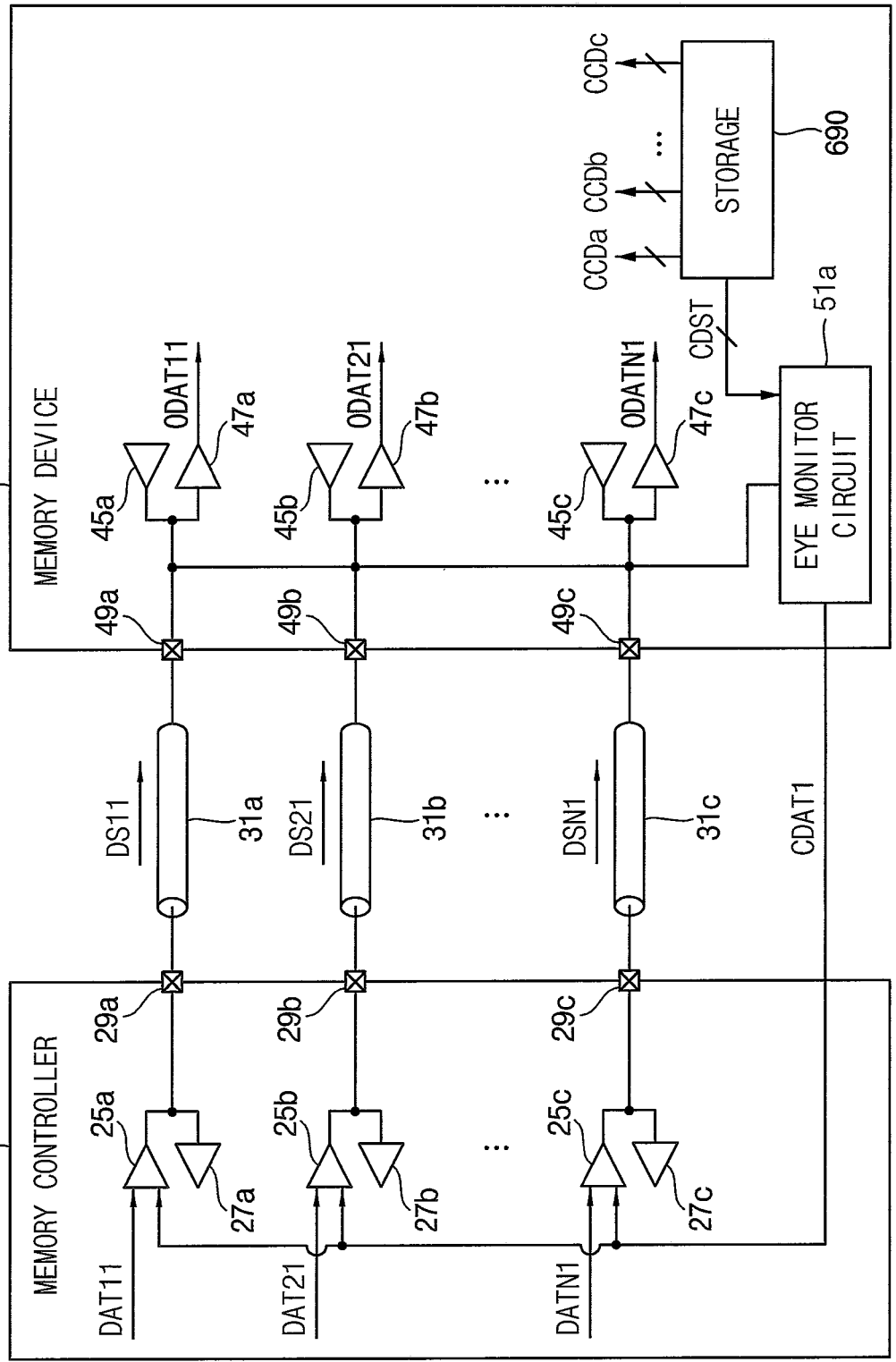

MULTI-LEVEL SIGNAL RECEIVERS AND MEMORY SYSTEMS INCLUDING THE SAME

REFERENCE TO PRIORITY APPLICATION

This application claims priority under 35 USC § 119 to Korean Patent Application No. 10-2020-0111665, filed Sep. 2, 2020, the disclosure of which is hereby incorporated herein by reference.

BACKGROUND

1. Technical Field

Example embodiments relate generally to semiconductor integrated circuits and, more particularly, to signal transmitters and receivers and memory systems including the same.

2. Description of the Related Art

Semiconductor memory devices can generally be divided into two categories depending upon whether or not they retain stored data when disconnected from a power supply. These categories include: (i) volatile memory devices, which lose stored data when disconnected from a power supply, and (ii) nonvolatile memory devices, which retain stored data when disconnected from a power supply. Volatile memory devices may perform read and write operations at a relatively high speed, while contents stored therein may be lost when powered off. In contrast, nonvolatile memory devices may retain contents stored therein even when powered off, which means they may be used to store data that must be retained regardless of whether they are powered.

Recently, as the performance of semiconductor memory device has improved, a high communication speed (or interface speed) is required between a memory controller and the semiconductor memory device. To support these higher communication speeds, multi-level signaling, in which a plurality of bits are transmitted during one unit interval (UI), has been researched.

SUMMARY

At least one example embodiment of the present disclosure provides a multi-level signal receiver capable of training sense amplifiers based on multi-level signaling.

At least one example embodiment of the present disclosure provides a memory system including a multi-level signal receiver capable of training sense amplifiers based on multi-level signaling.

According to some example embodiments, a multi-level signal receiver includes a data sampler having (M−1) sense amplifiers therein, which are configured to compare a multi-level signal having one of M voltage levels with (M−1) reference voltages, to thereby generate (M−1) comparison signals. The data sampler is further configured to generate a target data signal including N bits, where M is an integer greater than two and N is an integer greater than one. An equalization controller is provided, which is configured to train the (M−1) sense amplifiers by: (i) adjusting at least one of (M−1) voltage intervals during a first training mode, and (ii) adjusting levels of the (M−1) reference voltages during a second training mode, based on equalized values of the (M−1) comparison signals, where each of the (M−1) voltage intervals represents a difference between two adjacent voltage levels from among the M voltage levels.

In some of these embodiments, the M voltage levels include a first voltage level, a second voltage level (greater than the first voltage level), a third voltage level (greater than the second voltage level), and a fourth voltage level (greater than the third voltage level). In addition, the (M−1) reference voltages include a first reference voltage, a second reference voltage greater than the first reference voltage, and a third reference voltage greater than the second reference voltage. In addition, the M−1 sense amplifiers can include a first sense amplifier, which is configured to: (i) compare the multi-level signal received at a first input terminal with the first reference voltage received at a second input terminal, and (ii) output a first comparison signal at an output terminal, responsive to a clock signal. A second sense amplifier is also provided, which is configured to: (i) compare the multi-level signal received at a first input terminal with the second reference voltage received at a second input terminal, and (ii) output a second comparison signal at an output terminal, responsive to the clock signal. A third sense amplifier is provided, which is configured to: (i) compare the multi-level signal received at a first input terminal with the third reference voltage received at a second input terminal, and (ii) output a third comparison signal at an output terminal, responsive to the clock signal. The data sampler further includes a clock generator configured to generate the clock signal, and an output decoder, which is configured to decode the first comparison signal, the second comparison signal and the third comparison signal, and to output the target data signal.

According to these embodiments, a first equalizer is also provided, which has an input responsive to an inverted version of the first comparison signal and an output electrically coupled to the first input terminal of the first sense amplifier. A second equalizer is provided, which has an input responsive to the first comparison signal and an output electrically coupled to the second input terminal of the first sense amplifier. In addition, the equalization controller is configured to enable the first equalizer during the first training mode, and the first equalizer is configured to provide the first input terminal of the first sense amplifier with an equalized version of the first comparison signal. The equalization controller is further configured to adjust a first control equalization coefficient, which is provided as an input to the first equalizer during the first training mode.

According to additional embodiments, a multi-level signal receiver includes a data sampler, a reference voltage generator and an equalization controller. The data sampler includes (M−1) sense amplifiers to compare a multi-level signal having one of M voltage levels different from each other, received from a channel with (M−1) reference voltages, and to generate (M−1) comparison signals. The data sampler generates a target data signal including N bits based on the (M−1) comparison signals. Here, M is an integer greater than two and N is an integer greater than one. The reference voltage generator generates the (M−1) reference voltages. The equalization controller advantageously trains the (M−1) sense amplifiers by adjusting at least one of (M−1) voltage intervals during a first training mode and by adjusting levels of the (M−1) reference voltages during a second training mode, based on equalized values of the (M−1) comparison signals. Each of the (M−1) voltage intervals represents a difference between two adjacent voltage levels from among the M voltage levels.

According to other example embodiments, a memory system to transmit data based on a multi-level signal having one of M (M being an integer greater than two) voltage levels different from each other, includes a memory controller and a memory device. The memory controller includes a transmitter to generate the multi-level signal based on the input data. The memory device, which is connected to the memory controller through a channel, includes at least one multi-level signal receiver to receive the multi-level signal from the channel and compares the multi-level signal with (M−1) reference voltages to generate a target data signal including N bits, where N is an integer greater than one. The at least one multi-level signal receiver includes a data sampler, a reference voltage generator and an equalization controller. The data sampler includes (M−1) sense amplifiers to compare the multi-level signal with the (M−1) reference voltages to generate (M−1) comparison signals. The reference voltage generator generates the (M−1) reference voltages. The equalization controller trains the (M−1) sense amplifiers by adjusting at least one of (M−1) voltage intervals in a first training mode, and by adjusting levels of the (M−1) reference voltages in second training mode, based on equalized values of the (M−1) comparison signals. Each of the (M−1) voltage intervals represents a difference between two adjacent voltage levels from among the M voltage levels.

According to further embodiments, a multi-level signal receiver includes a data sampler, a reference voltage generator and an equalization controller. The data sampler includes first through third sense amplifiers, which compare a multi-level signal having one of first through fourth voltage levels different from each other with respective first through third reference voltages to generate corresponding first through third comparison signals. The data sampler generates a target data signal including two bits based on the first through third comparison signals. A reference voltage generator is provided, which is configured to generate the first through third reference voltages. The equalization controller trains the (M−1) sense amplifiers by adjusting at least one of first through third voltage intervals in a first training mode and by adjusting levels of the first through third reference voltages in second training mode, based on equalized values of the first through third comparison signals. Each of the first through voltage intervals represents a difference between two adjacent voltage levels from among the first through fourth voltage levels. The first sense amplifier compares the multi-level signal with the first reference voltage to output the first comparison signal based on a clock signal. The second sense amplifier compares the multi-level signal with the second reference voltage to output the second comparison signal based on the clock signal. The third sense amplifier compares the multi-level signal with the third reference voltage to output the third comparison signal based on the clock signal. The second reference voltage has a level greater than a level of the first reference voltage and the third reference voltage has a level greater the level of the second reference voltage.

Accordingly, the multi-level signal receiver may use (M−1) sense amplifiers to compare a multi-level signal having one of M voltage levels different from each other with (M−1) reference voltages, and may train the (M−1) sense amplifiers by adjusting voltage intervals of the M voltage levels or levels of the (M−1) reference voltages by using equalizers. Therefore, the multi-level signal receiver may enhance performance.

BRIEF DESCRIPTION OF THE DRAWINGS

Illustrative, non-limiting example embodiments will be more clearly understood from the following detailed description taken in conjunction with the accompanying drawings.

FIG. 22 is block diagrams illustrating an example of a memory system of FIG. 1 according to example embodiments.

DETAILED DESCRIPTION OF THE EMBODIMENTS

Figure 1:
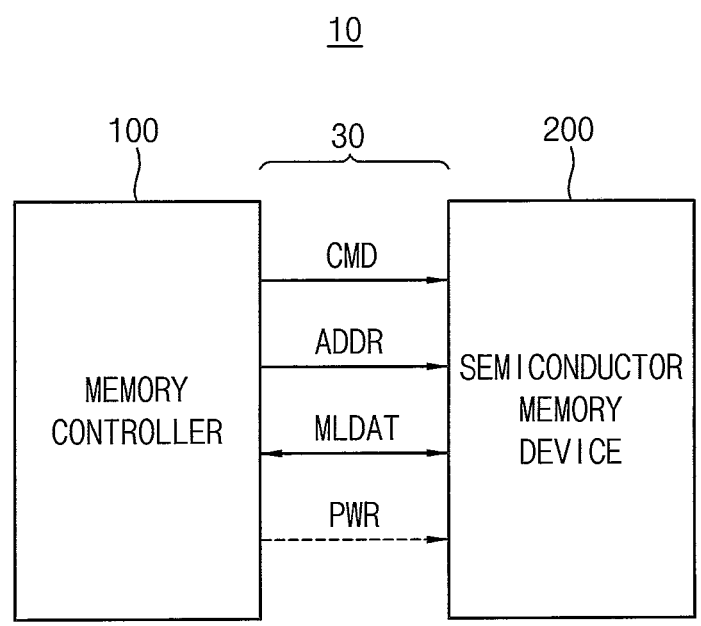
FIG. 1 is a block diagram illustrating a memory system according to example embodiments.

Various example embodiments will be described more fully with reference to the accompanying drawings, in which embodiments are shown. The present disclosure may, however, be embodied in many different forms and should not be construed as limited to the embodiments set forth herein. Like reference numerals refer to like elements throughout this application.

The multi-level signaling scheme may be used as a means of compressing the bandwidth required to transmit data at a given bit rate. In a simple binary scheme, two single symbols, usually two voltage levels, may be used to represent '1' and '0,' and thus the symbol rate may be equal to the bit rate. In contrast, the principle of the multi-level signaling scheme may be to use a larger alphabet of m symbols to represent data, so that each symbol may represent more than one bit of data. As a result, the number of symbols that needs to be transmitted may be less than the number of bits (e.g., the symbol rate may be less than the bit rate), and thus the bandwidth may be compressed. The alphabet of symbols may be constructed from a number of different voltage levels. For example, in a four-level scheme, groups of two data bits may be mapped to one of four symbols. Only one symbol need be transmitted for each pair of data bits, so the symbol rate may be a half of the bit rate.

In other words, the multi-level signaling scheme may be used to increase a data transmission (or transfer) rate without increasing the frequency of data transmission and/or a transmission power of the communicated data. An example of one type of the multi-level signaling scheme may be a pulse amplitude modulation (PAM) scheme, where a unique symbol of a multi-level signal may represent a plurality of bits of data. The number of possible pulse amplitudes in a digital PAM scheme may be some power of two. For example, there may be $2^2$ possible discrete pulse amplitudes in a 4-level PAM (e.g., in PAM4), there may be $2^3$ possible discrete pulse amplitudes in an 8-level PAM (e.g., in PAM8), and there may be $2^4$ possible discrete pulse amplitudes in a 16-level PAM (e.g., in PAM16). However, example embodiments are not limited thereto, and example embodiments may be applied or employed to a K-level PAM (e.g., PAM(K)) having K possible pulse amplitudes, where K is a natural number greater than or equal to three.

FIG. 1 is a block diagram illustrating a memory system according to example embodiments. Referring to FIG. 1, a memory system 10 includes a memory controller 100 and a semiconductor memory device 200. The memory system 10 may further include a plurality of signal lines 30 that electrically connect the memory controller 100 with the semiconductor memory device 200. The semiconductor memory device 200 is at least partially controlled by the memory controller 100. For example, based on requests from a host (not illustrated), the memory controller 100 may store (e.g., write or program) data into the semiconductor memory device 200, or may retrieve (e.g., read or sense) data from the semiconductor memory device 200.

The plurality of signal lines 30 may include control lines, command lines, address lines, data input/output (I/O) lines and power lines. The memory controller 100 may transmit a command CMD, an address ADDR and a control signal CTRL to the memory device 40 via the command lines, the address lines and the control lines, and may exchange a data signal MLDAT with the semiconductor memory device 200 via the data I/O lines, and may transmit a power supply voltage PWR to the semiconductor memory device 200 via the power lines. For example, the data signal MLDAT may be the multi-level signal that is generated and transmitted according to example embodiments. Although not illustrated in FIG. 1, the plurality of signal lines 30 may further include data strobe signal (DQS) lines for transmitting a DQS signal.

In some example embodiments, at least a part or all of the signal lines 30 may be referred to as a channel. The term "channel" as used herein may represent signal lines that include the data I/O lines for transmitting the data signal MLDAT. However, example embodiments are not limited thereto, and the channel may further include the command lines for transmitting the command CMD and/or the address lines for transmitting the address ADDR.

Figure 2:
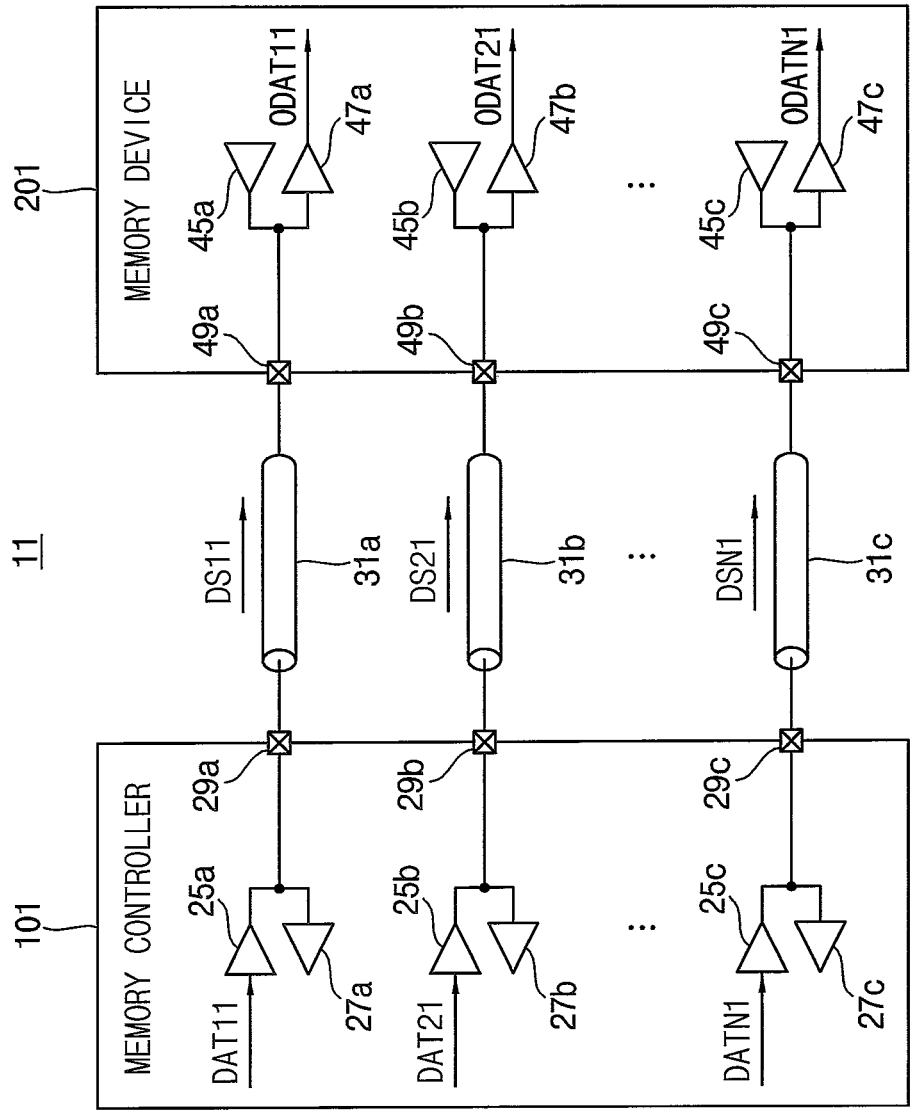
FIGS. 2 and 3 are block diagrams illustrating an example of a memory system of FIG. 1.
Figure 3:
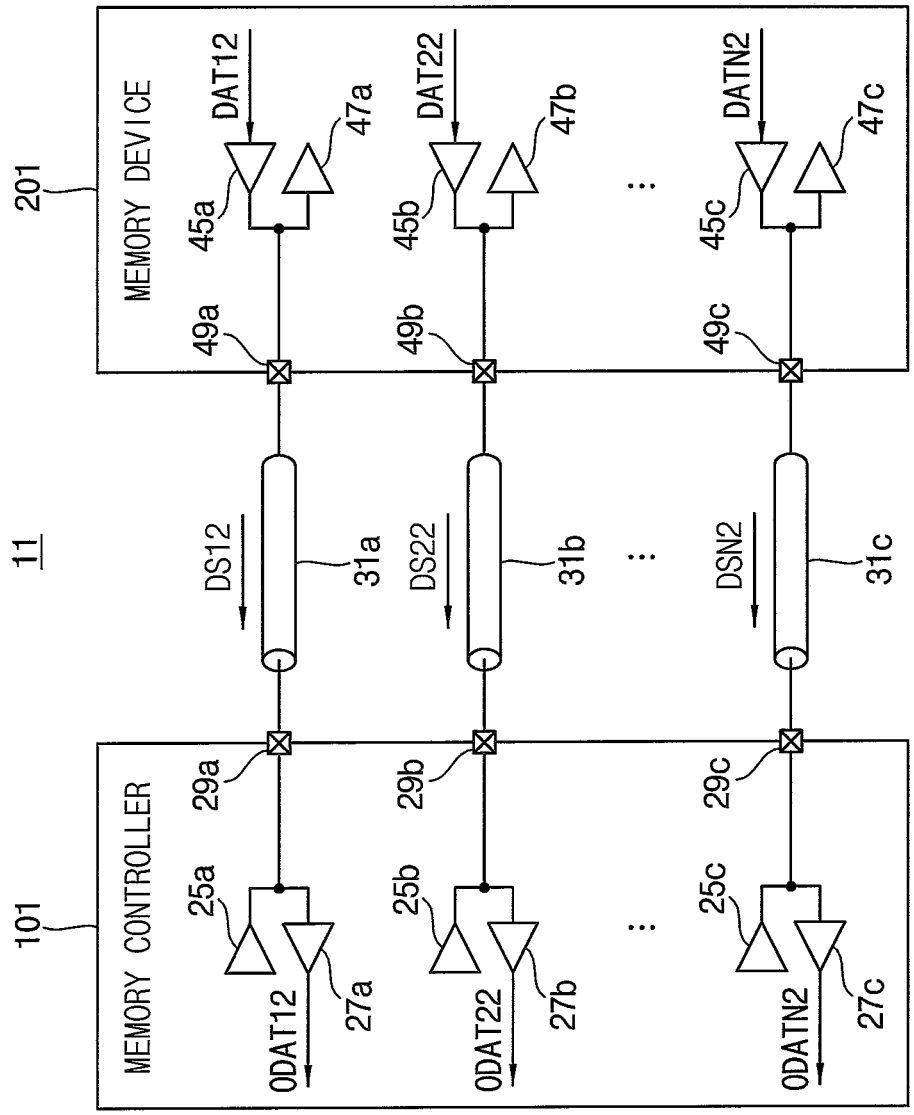

FIGS. 2 and 3 are block diagrams illustrating an example of a memory system of FIG. 1. Referring to FIGS. 2 and 3, a memory system 11 includes a memory controller 101, a semiconductor memory device 201 and a plurality of channels 31a, 31b and 31c. The memory controller 101 may include a plurality of transmitters 25a, 25b and 25c, a plurality of receivers 27a, 27b and 27c, and a plurality of data I/O pads 29a, 29b and 29c. The semiconductor memory device 201 may include a plurality of transmitters 45a, 45b and 45c, a plurality of receivers 47a, 47b and 47c, and a plurality of data I/O pads 49a, 49b and 49c.

Advantageously, each of the plurality of transmitters 25a, 25b, 25c, 45a, 45b and 45c may generate a multi-level signal, and may perform the method of generating multi-level signal. Each of the plurality of receivers 27a, 27b, 27c, 47a, 47b and 47c may receive the multi-level signal. The plurality of transmitters 25a, 25b, 25c, 45a, 45b and 45c and the plurality of receivers 27a, 27b, 27c, 47a, 47b and 47c may transmit and receive multi-level signal through the plurality of channels 31a, 31b and 31c. As shown, each of the plurality of data I/O pads 29a, 29b, 29c, 49a, 49b and 49c may be connected to a respective one of the plurality of transmitters 25a, 25b, 25c, 45a, 45b and 45c and a respective one of the plurality of receivers 27a, 27b, 27c, 47a, 47b and 47c. The plurality of channels 31a, 31b and 31c may connect the memory controller 201 with the semiconductor memory device 201. Each of the plurality of channels 31a, 31b and 31c may be connected to a respective one of the plurality of transmitters 25a, 25b and 25c and a respective one of the plurality of receivers 27a, 27b and 27c through a respective one of the plurality of data I/O pads 29a, 29b and 29c. In addition, each of the plurality of channels 31a, 31b and 31c may be connected to a respective one of the plurality of transmitters 45a, 45b and 45c and a respective one of the plurality of receivers 47a, 47b and 47c through a respective one of the plurality of data I/O pads 49a, 49b and 49c. The multi-level signal may be transmitted through each of the plurality of channels 31a, 31b and 31c.

FIG. 2 illustrates an operation of transferring data from the memory controller 101 to the semiconductor memory device 201. For example, the transmitter 25a may generate an output data signal DS11, which is the multi-level signal, based on input data DAT11, the output data signal DS11 may be transmitted from the memory controller 21 to the memory device 41 through the channel 31a, and the receiver 47a may receive the output data signal DS11 to obtain data ODAT11 corresponding to the input data DAT11. Similarly, the transmitter 25b may generate an output data signal DS21, which is the multi-level signal, based on input data DAT21, the output data signal DS21 may be transmitted to the memory device 41 through the channel 31b, and the receiver 47b may receive the output data signal DS21 to obtain data ODAT21 corresponding to the input data DAT21. The transmitter 25c may generate an output data signal DSN1, which is the multi-level signal, based on input data DATN1, the output data signal DSN1 may be transmitted to the semiconductor memory device 201 through the channel 31c, and the receiver 47c may receive the output data signal DSN1 to obtain data ODATN1 corresponding to the input data DATN1. For example, the input data DAT11, DAT21 and DATN1 may be write data to be written into the semiconductor memory device 201.

Alternatively, FIG. 3 illustrates an operation of transferring data from the semiconductor memory device 201 to the memory controller 101. For example, the transmitter 45a may generate an output data signal DS12, which is the multi-level signal, based on input data DAT12, and the output data signal DS12 may be transmitted from the memory device 41 to the memory controller 21 through the channel 31a, and the receiver 27a may receive the output data signal DS12 to obtain data ODAT12 corresponding to the input data DAT12. Similarly, the transmitter 45b may generate an output data signal DS22, which is the multi-level signal, based on input data DAT22, and the output data signal DS22 may be transmitted to the memory controller 21 through the channel 31b, and the receiver 27b may receive the output data signal DS22 to obtain data ODAT22 corresponding to the input data DAT22. The transmitter 45c may generate an output data signal DSN2, which is the multi-level signal, based on input data DATN2, and the output data signal DSN2 may be transmitted to the memory controller 101 through the channel 31c, and the receiver 27c may receive the output data signal DSN2 to obtain data ODATN2 corresponding to the input data DATN2. For example, the input data DAT12, DAT22 and DATN2 may be read data retrieved from the semiconductor memory device 201 in response to a READ command issued by the memory controller 101.

Figure 4:
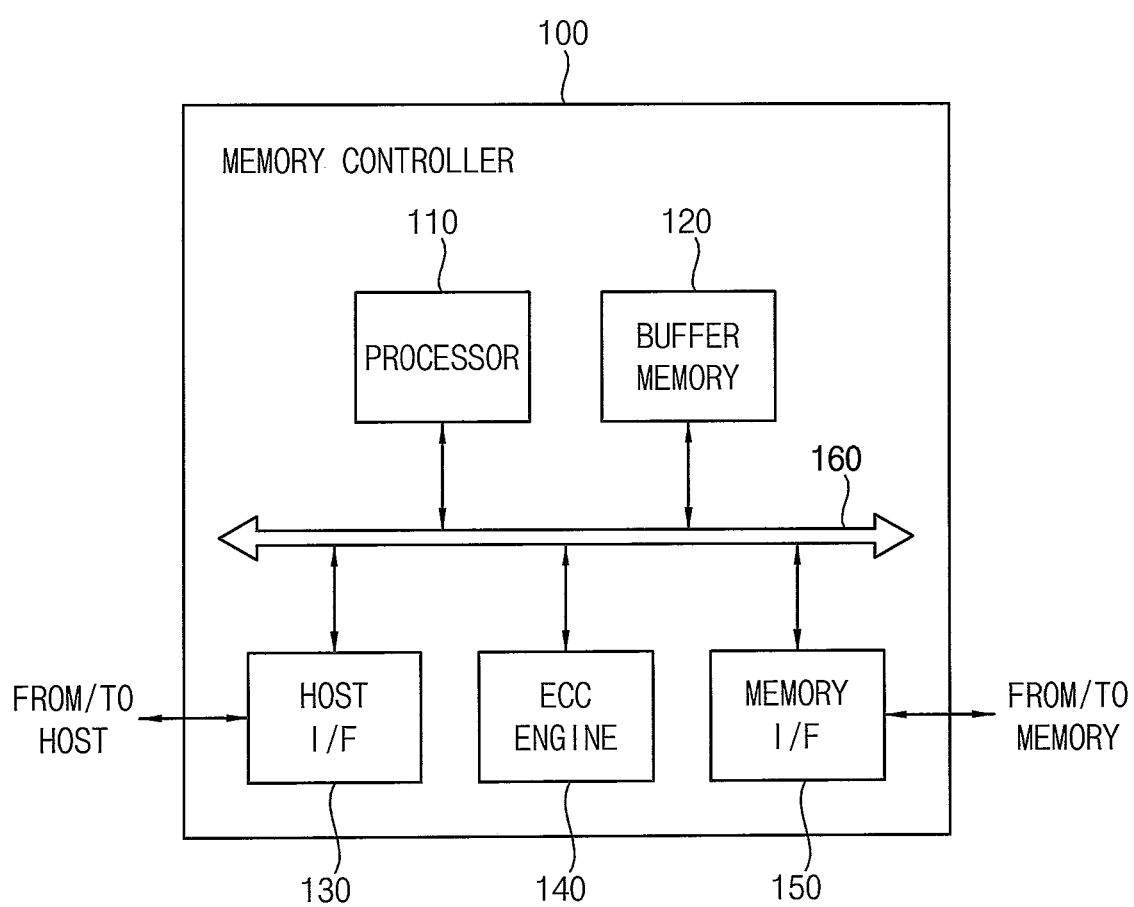
FIG. 4 is a block diagram illustrating an example of a memory controller included in a memory system according to example embodiments.

FIG. 4 is a block diagram illustrating an example of a memory controller included in a memory system according to example embodiments. Referring to FIG. 4, a memory controller 100 may include at least one processor 110, a buffer memory 120, a host interface 130, an error correction code (ECC) engine 140 and a memory interface 150. The processor 110 may control an operation of the memory controller 100 in response to a command and/or request received via the host interface 130 from an external host (not illustrated). For example, the processor 110 may control respective components by employing firmware for operating a memory device (e.g., the semiconductor memory device 200 in FIG. 1).

The buffer memory 120 may store instructions and data executed and processed by the processor 110. For example, the buffer memory 120 may be implemented with a volatile memory device such as a dynamic random access memory (DRAM), a static random access memory (SRAM), a cache memory, or the like. The host interface 130 may provide physical connections between the host and the memory controller 100. The host interface 130 may provide an interface corresponding to a bus format of the host for communication between the host and the memory controller 100.

The ECC engine 140, which is provided for error correction, may perform coded modulation using a Bose-Chaudhuri-Hocquenghem (BCH) code, a low density parity check (LDPC) code, a turbo code, a Reed-Solomon code, a convolution code, a recursive systematic code (RSC), a trellis-coded modulation (TCM), a block coded modulation (BCM), etc., or may perform ECC encoding and ECC decoding using above-described codes or other error correction codes.

The memory interface 150 may exchange data with the semiconductor memory device 200. The memory interface 150 may transmit a command and an address to the semiconductor memory device 200, and may transmit data to the semiconductor memory device 200 or receive data read from the semiconductor memory device 200. Although not illustrated in FIG. 4, a transmitter (e.g., the transmitter 25a in FIG. 2), which generates the multi-level signal according to example embodiments, and a receiver (e.g., the receiver 27a in FIG. 2), which receives the multi-level signal, may be included in the memory interface 150 (see, e.g., memory controller 101 of FIG. 3).

Figure 5:
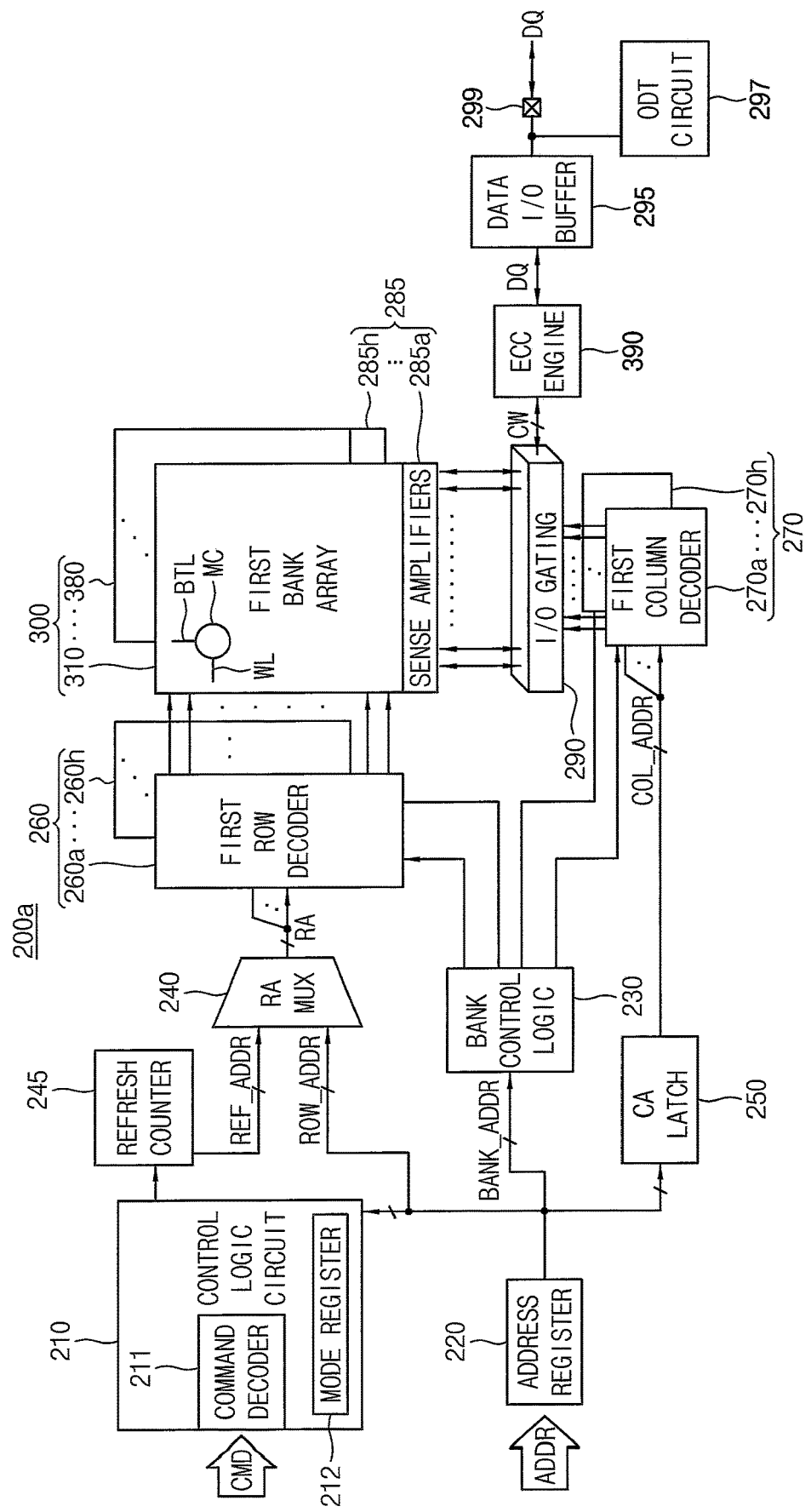
FIG. 5 is a block diagram illustrating an example of the semiconductor memory device included in the memory system of FIG. 1 according to example embodiments.

FIG. 5 is a block diagram illustrating an example of the semiconductor memory device included in the memory system of FIG. 1, according to additional embodiments. Referring to FIG. 5, the semiconductor memory device 200a includes the control logic circuit 210, an address register 220, a bank control logic 230, a refresh counter 245, a row address multiplexer 240, a column address latch 250, a row decoder 260, a column decoder 270, the memory cell array 300, a sense amplifier unit 285, an I/O gating circuit 290, an error correction code (ECC) engine 390, an on-die termination (ODT) circuit 297 and a data I/O buffer 295. In some embodiments, the semiconductor memory device 200a may be a volatile memory device and may include a dynamic random access memory (DRAM) device.

The memory cell array 300 includes first through eighth bank arrays 310~380. The row decoder 260 includes first through eighth bank row decoders 260a~260h respectively coupled to the first through eighth bank arrays 310~380, the column decoder 270 includes first through eighth bank column decoders 270a~270h respectively coupled to the first through eighth bank arrays 310~380, and the sense amplifier unit 285 includes first through eighth bank sense amplifiers 285a~285h respectively coupled to the first through eighth bank arrays 310~380. The first through eighth bank arrays 310~380, the first through eighth bank row decoders 260a~260h, the first through eighth bank column decoders 270a~270h and first through eighth bank sense amplifiers 285a~285h may form first through eighth banks. Each of the first through eighth bank arrays 310~380 includes a plurality of memory cells MC formed at intersections of a plurality of word-lines WL and a plurality of bit-line BTL. The address register 220 receives the address ADDR including a bank address BANK_ADDR, a row address ROW_ADDR and a column address COL_ADDR from the memory controller 100. The address register 220 provides the received bank address BANK_ADDR to the bank control logic 230, provides the received row address ROW_ADDR to the row address multiplexer 240, and provides the received column address COL_ADDR to the column address latch 250. The bank control logic 230 generates bank control signals in response to the bank address BANK_ADDR. One of the first through eighth bank row decoders 260a~260h corresponding to the bank address BANK_ADDR is activated in response to the bank control signals, and one of the first through eighth bank column decoders 270a~270h corresponding to the bank address BANK_ADDR is activated in response to the bank control signals.

The row address multiplexer 240 receives the row address ROW_ADDR from the address register 220, and receives a refresh row address REF_ADDR from the refresh counter 245. The row address multiplexer 240 selectively outputs the row address ROW_ADDR or the refresh row address REF_ADDR as a row address RA. The row address RA that is output from the row address multiplexer 240 is applied to the first through eighth bank row decoders 260a~260h. The refresh counter 245 may sequentially output the refresh row address REF_ADDR under control of the control logic circuit 210. The activated one of the first through eighth bank row decoders 260a~260h, by the bank control logic 230, decodes the row address RA that is output from the row address multiplexer 240, and activates a word-line corresponding to the row address RA. For example, the activated bank row decoder applies a word-line driving voltage to the word-line corresponding to the row address.

The column address latch 250 receives the column address COL_ADDR from the address register 220, and temporarily stores the received column address COL_ADDR. In some embodiments, in a burst mode, the column address latch 250 generates column addresses that increment from the received column address COL_ADDR. The column address latch 250 applies the temporarily stored or generated column address to the first through eighth bank column decoders 270a~270h. The activated one of the first through eighth bank column decoders 270a~270h activates a sense amplifier corresponding to the bank address BANK_ADDR and the column address COL_ADDR through the I/O gating circuit 290. The I/O gating circuit 290 includes a circuitry for gating input/output data, and further includes input data mask logic, read data latches for storing data that is output from the first through eighth bank arrays 310~380, and write drivers for writing data to the first through eighth bank arrays 310~380.

Codeword CW read from one bank array of the first through eighth bank arrays 310~380 is sensed by a sense amplifier coupled to the one bank array from which the data is to be read, and is stored in the read data latches. The codeword CW stored in the read data latches may be provided to the memory controller 100 via the data I/O buffer 295 after ECC decoding is performed on the codeword CW by the ECC engine 390. The data DQ to be written in one bank array of the first through eighth bank arrays 310~380 may be provided to the data I/O buffer 295 from the memory controller 100, and may be provided to the ECC engine 390 from the data I/O buffer 295. And, the ECC engine 390 may perform an ECC encoding on the data DQ to generate parity bits, and may provide the data DQ and the parity bits to the I/O gating circuit 290, which may write the data DQ and the parity bits in a sub-page in one bank array through the write drivers.

The data I/O buffer 295 may provide the target data signal DQ 100 to the ECC engine 390 in a write operation of the semiconductor memory device 200a, and may provide the data signal DQ from the ECC engine 390 to the memory controller 100 in a read operation of the semiconductor memory device 200a. The data I/O buffer 295 may include a multi-level signal receiver according to example embodiments, may decode the multi-level data MLDAT into a target data signal, and may provide the target data signal to the ECC engine 390 in a write operation. The ECC engine 390 may perform ECC encoding and ECC decoding on the target data signal DQ according to a control of the control logic circuit 210.

The control logic circuit 210 may control operations of the semiconductor memory device 200a. For example, the control logic circuit 210 may generate control signals for the semiconductor memory device 200a in order to perform a write operation or a read operation. The control logic circuit 210 includes a command decoder 211 that decodes the command CMD received from the memory controller 100 and a mode register 212 that sets an operation mode of the semiconductor memory device 200a. For example, the command decoder 211 may generate the control signals corresponding to the command CMD by decoding a write enable signal, a row address strobe signal, a column address strobe signal, and a chip select signal, etc.

The ODT circuit 297 may be connected to a data I/O pad 299 and the data I/O buffer 295. When the ODT circuit 297 is enabled, the ODT circuit 297 may perform an ODT operation. When the ODT operation is performed, signal integrity of the transmitted/received signal may be enhanced by preventing signal reflection due to impedance matching.

Although the memory device included in the memory system according to example embodiments is described based on a DRAM, the memory device according to example embodiments may be any volatile memory device (e.g., SRAM), and/or any nonvolatile memory device, e.g., a flash memory, a phase random access memory (PRAM), a resistive random access memory (RRAM), a nano floating gate memory (NFGM), a polymer random access memory (PoRAM), a magnetic random access memory (MRAM), a ferroelectric random access memory (FRAM), a thyristor random access memory (TRAM), etc.

Figure 6:
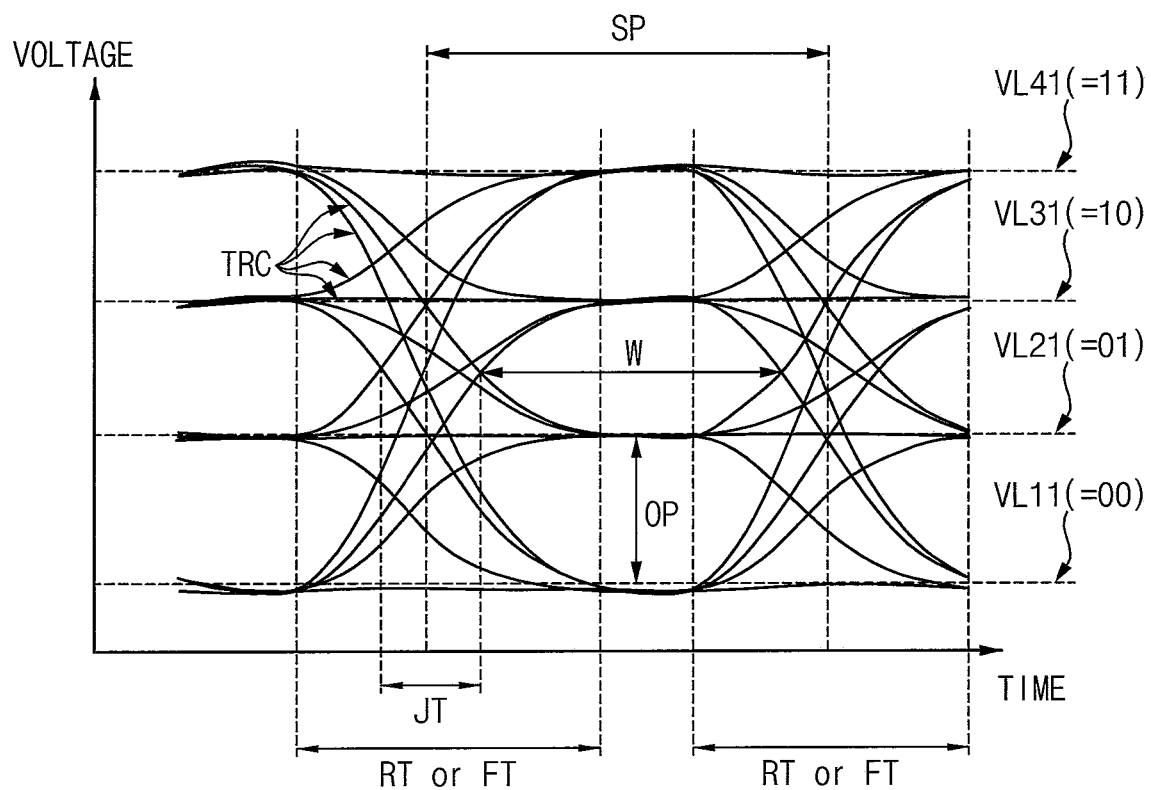
FIGS. 6 and 7 are diagrams for describing a data signal generated by a method of generating a multi-level signal according to example embodiments.
Figure 7:
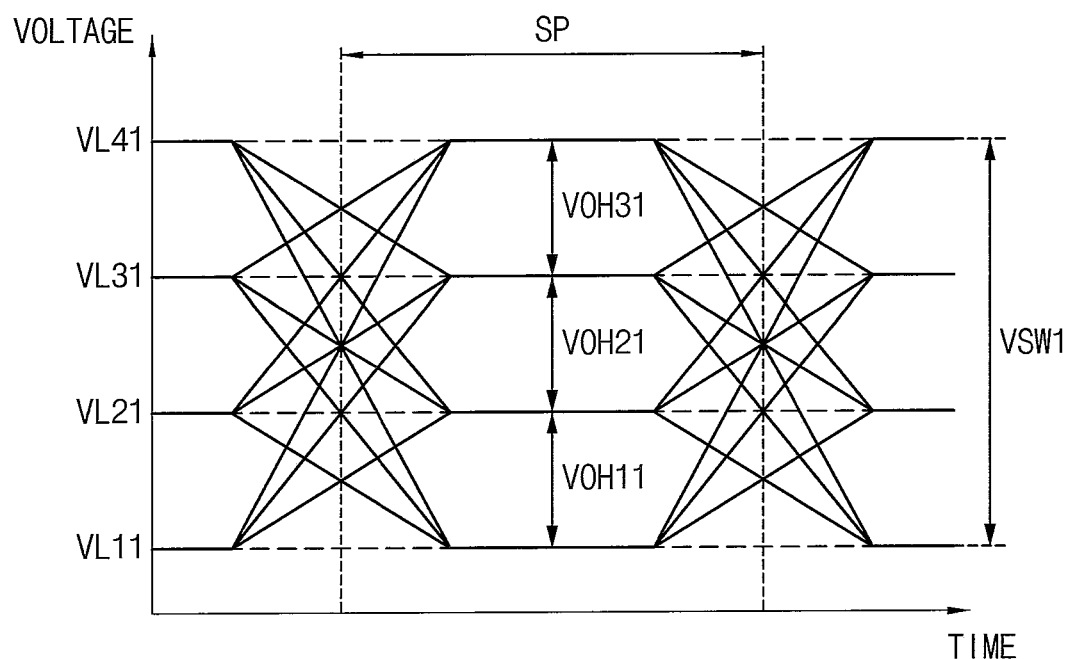

Hereinafter, example embodiments will be described in detail based on various examples of the multi-level signaling scheme (e.g., the PAM scheme) and various examples of the transmitter according thereto. In particular, FIGS. 6 and 7 are diagrams for describing a data signal generated by a method of generating a multi-level signal according to example embodiments. For example, FIG. 6 illustrates an ideal eye diagram of a data signal (e.g., a PAM4 signal) generated based on the 4-level scheme (e.g., the PAM4 scheme), whereas FIG. 7 is a simplified diagram illustrating the eye diagram of FIG. 6. Referring to FIG. 6, an eye diagram may be used to indicate the quality of signals in high-speed transmissions. For example, the eye diagram may represent four symbols of a signal (e.g., '00,' '01,' '10' and '11'), and each of the four symbols may be represented by a respective one of different voltage levels (e.g., voltage amplitudes) VL11, VL21, VL31 and VL41. The eye diagram may be used to provide a visual indication of the health of the signal integrity, and may indicate noise margins of the data signal.

To generate the eye diagram, an oscilloscope or other computing device may sample a digital signal according to a sample period SP (e.g., a unit interval or a bit period). The sample period SP may be defined by a clock associated with the transmission of the measured signal. The oscilloscope or other computing device may measure the voltage level of the signal during the sample period SP to form the plurality of traces TRC. Various characteristics associated with the measured signal may be determined by overlaying the plurality of traces TRC.

As will be understood by those skilled in the art, an eye diagram may be used to identify a number of characteristics of a communication signal such as jitter, crosstalk, electromagnetic interference (EMI), signal loss, signal-to-noise ratio (SNR), other characteristics, or combinations thereof. For example, a width W of an eye in the eye diagram may be used to indicate a timing synchronization of the measured signal or jitter effects of the measured signal. For example, the eye diagram may indicate an eye opening OP, which represents a peak-to-peak voltage difference between the various voltage levels VL11, VL21, VL31 and VL41. The eye opening OP may be related to a voltage margin for discriminating between different voltage levels VL11, VL21, VL31 and VL41 of the measured signal. The eye opening OP may correspond to the voltage interval described with reference to FIG. 1. For example, the eye diagram may be used to identify a rise time RT and/or a fall time FT for transitions from a first amplitude to a second amplitude. The rise time RT or the fall time FT may indicate a time required for transitioning from one voltage level to another voltage level, and may be related to or associated with a rising edge and a falling edge, respectively. The jitter JT may refer to a timing error which results from a misalignment of rise and fall times. The jitter JT may occur when the rising edge or the falling edge occurs at a time that is different from an ideal time defined by the data clock.

Referring to FIG. 7, different first, second, third and fourth voltage levels VL11, VL21, VL31 and VL41 of the data signal that is the PAM4 signal are illustrated, different first, second and third voltage intervals VOH11, VOH21 and VOH31 of the data signal are illustrated, and a voltage swing width VSW1 of the data signal is illustrated. The first voltage level VL11 that is the lowest voltage level may be lower than the second voltage level VL21, the second voltage level VL21 may be lower than the third voltage level VL31, and the third voltage level VL31 may be lower than the fourth voltage level VL41, which is the highest voltage level. In addition, the first voltage interval VOH11 may represent a difference between the first and second voltage levels VL11 and VL21, the second voltage interval VOH21 may represent a difference between the second and third voltage levels VL21 and VL31, the third voltage interval VOH31 may represent a difference between the third and fourth voltage levels VL31 and VL41, and the voltage swing width VSW1 may represent a difference between the first and fourth voltage levels VL11 and VL41.

Figure 8:
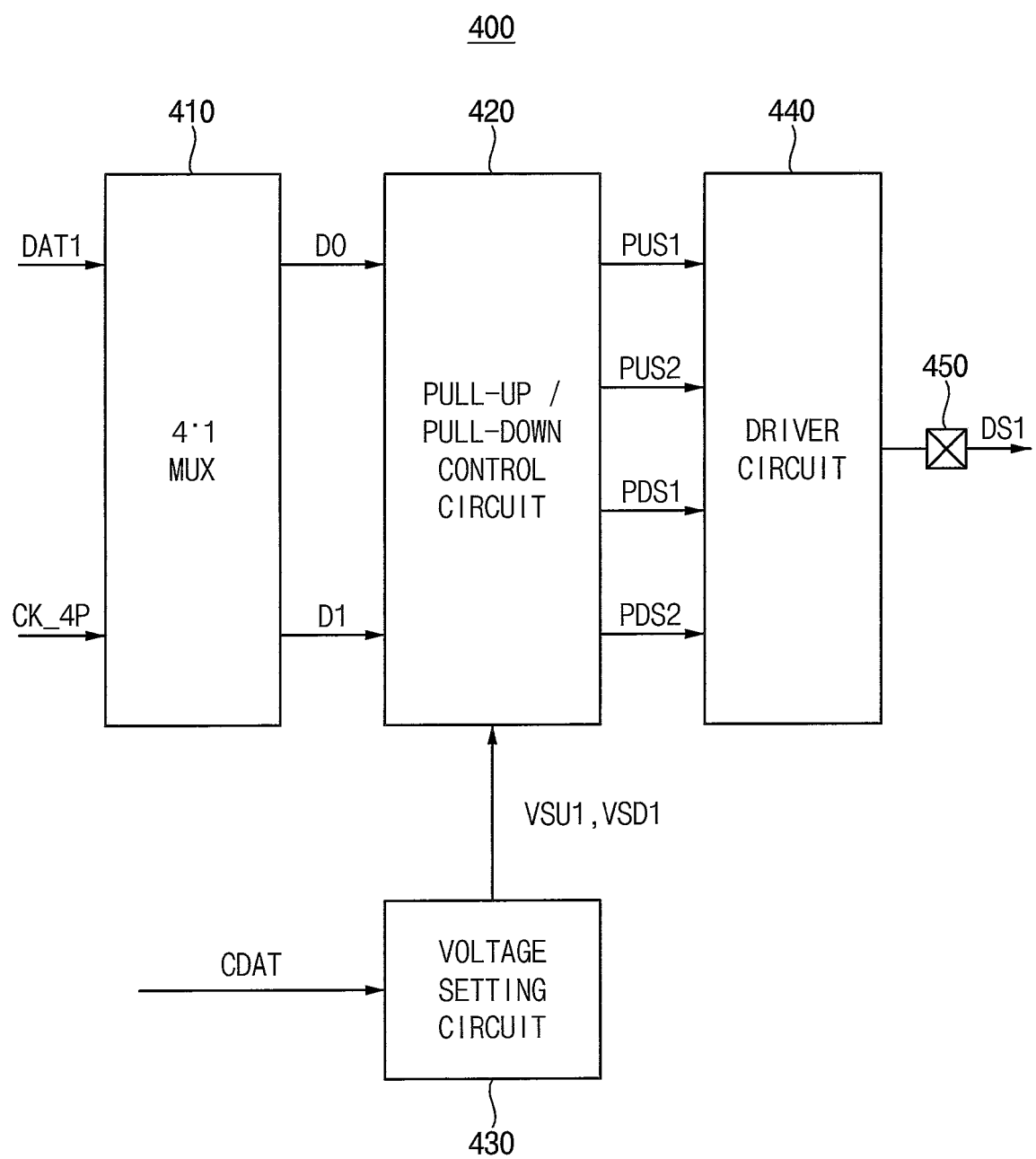
FIG. 8 is a block diagram illustrating a transmitter according to example embodiments.

FIG. 8 is a block diagram illustrating a transmitter according to example embodiments. Referring to FIG. 8, a transmitter 400 includes a pull-up/pull-down control circuit 420, a voltage setting circuit 430 and a driver circuit 440. The transmitter 400 may further include a multiplexer 410 and a data I/O pad 450. The multiplexer 410 may receive input data DAT1 including two or more bits D0 and D1, and may divide the input data DAT1 into the two or more bits D0 and D1. The pull-up/pull-down control circuit 420 generates two or more pull-up control signals PUS1 and PUS2 and two or more pull-down control signals PDS1 and PDS2 based on the input data DAT1 (e.g., the two or more bits D0 and D1) and voltage setting control signals VSU1 and VSD1. The voltage setting circuit 430 performs a voltage setting operation for voltage intervals of a multi-level signal and generates the voltage setting control signals VSU1 and VSD1 that represent a result of the voltage setting operation. The driver circuit 440 generates an output data signal DS1 that is the multi-level signal based on the two or more pull-up control signals PUS1 and PUS2 and the two or more pull-down control signals PDS1 and PDS2. The data I/O pad 450 may output the output data signal DS1. The multi-level signal has one of M voltage levels. When the voltage setting operation is performed, M−1 voltage intervals each of which represents a difference between two adjacent voltage levels are different from each other.

Based on a characteristic data CDAT, the voltage setting circuit 430 may select at least one voltage level to be adjusted and may generate the voltage setting control signals VSU1 and VSD1. The characteristic data CDAT may represent a characteristic of a channel that transmits the output data signal DS1. The characteristic data CDAT may be generated based on a training operation on a multi-level signal receiver in the semiconductor memory device 200 and the semiconductor memory device 200 may transmit the characteristic data CDAT to the voltage setting circuit 430. In example embodiments, an eye monitor circuit (such as an eye monitor circuit 51a) in the semiconductor memory device 200 may transmit the characteristic data CDAT to the voltage setting circuit 430 based on the training result.

In an example of FIG. 8, the input data DAT1 may include a first bit D0 and a second bit D1 that are different from each other, and the multiplexer 410 may divide the input data DAT1 into the first bit D0 and the second bit D1 based on a four-phase clock signal CK_4P. In some example embodiments, the first bit D0 may be a least significant bit (LSB) of the input data DAT1, and the second bit D1 may be a most significant bit (MSB) of the input data DAT1.

Figure 9:
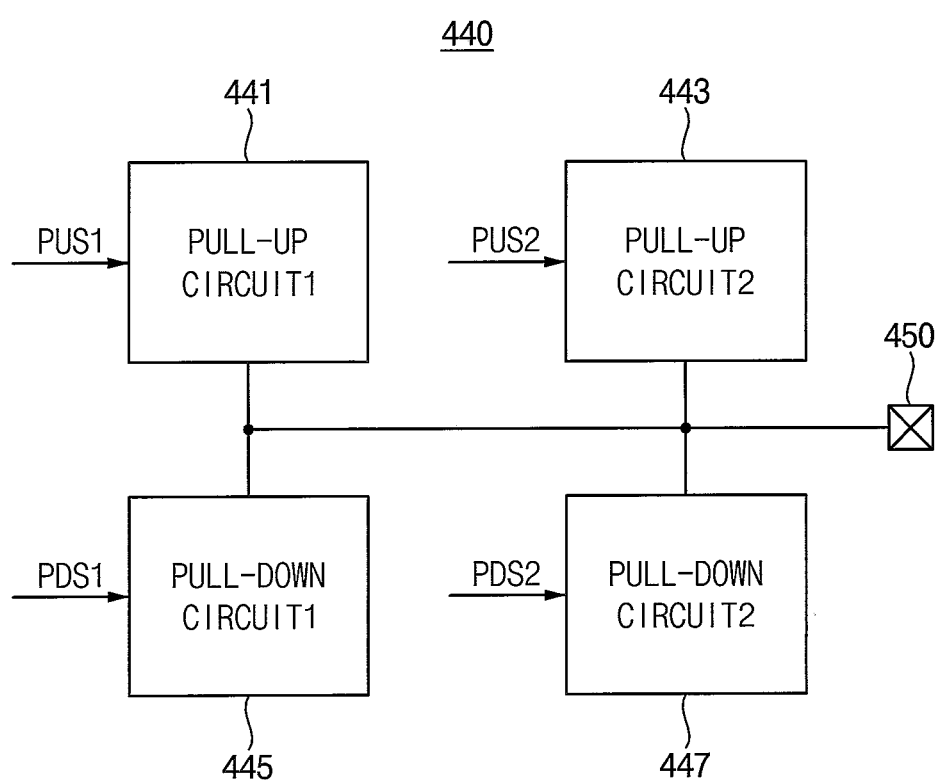
FIGS. 9 and 10 are diagrams illustrating examples of a driver circuit included in a transmitter of FIG. 8.
Figure 10:
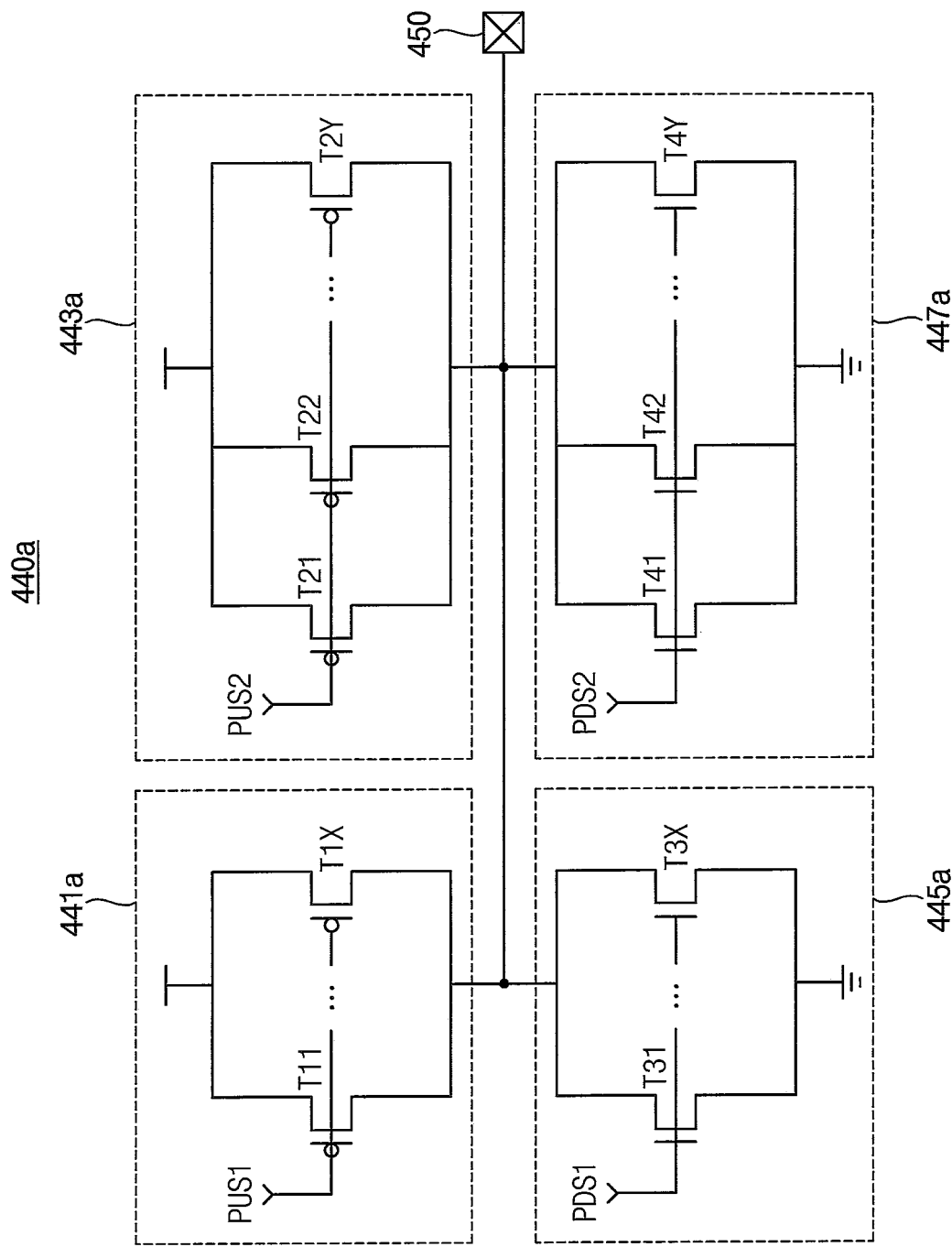

FIGS. 9 and 10 are diagrams illustrating examples of a driver circuit included in a transmitter of FIG. 8. Referring to FIG. 9, the driver circuit 440 may include a first pull-up circuit 441, a second pull-up circuit 443, a first pull-down circuit 445 and a second pull-down circuit 447. The first pull-up circuit 441 may pull up the data I/O pad 450 based on the first pull-up control signal PUS1. The second pull-up circuit 443 may pull up the data I/O pad 450 based on the second pull-up control signal PUS2. The first pull-down circuit 445 may pull down the data I/O pad 450 based on the first pull-down control signal PDS1. The second pull-down circuit 447 may pull down the data I/O pad 450 based on the second pull-down control signal PDS2.

And, as shown by FIG. 10, a driver circuit 440a may include a first pull-up circuit 441a, a second pull-up circuit 443a, a first pull-down circuit 445a and a second pull-down circuit 447a. The first pull-up circuit 441a may include a plurality of first pull-up transistors T11, . . . , T1X that are connected in parallel between a power supply voltage and the data I/O pad 450. The plurality of first pull-up transistors T11, . . . , T1X may be selectively turned on based on the first pull-up control signal PUS1. The second pull-up circuit 443a may include a plurality of second pull-up transistors T21, T22, . . . , T2Y that are connected in parallel between the power supply voltage and the data I/O pad 450. The plurality of second pull-up transistors T21, T22, . . . , T2Y may be selectively turned on based on the second pull-up control signal PUS2.

Thus, when it is required to pull up the output data signal DS1 to the second voltage level VL21, the first pull-up circuit 441a may be enabled or activated by turning on at least some of the plurality of first pull-up transistors T11, . . . , T1X based on the first pull-up control signal PUS1. In this case, the second voltage level VL21 may be adjusted by controlling the number (or quantity) of the plurality of first pull-up transistors T11, . . . , T1X that are turned on. For example, the second voltage level VL21 may increase as the number of the plurality of first pull-up transistors T11, . . . , T1X that are turned on increases. Similarly, when it is required to pull up the output data signal DS1 to the third voltage level VL31, the second pull-up circuit 443a may be enabled based on the second pull-up control signal PUS2, and the third voltage level VL31 may be adjusted by controlling the number of the plurality of second pull-up transistors T21, T22, . . . , T2Y that are turned on. And, when it is required to pull up the output data signal DS1 to the fourth voltage level VL41, both the first and second pull-up circuits 441a and 443a may be simultaneously enabled based on the first and second pull-up control signals PUS1 and PUS2, and the fourth voltage level VL41 may be adjusted by controlling the number of the plurality of first pull-up transistors T11, . . . , T1X and the plurality of second pull-up transistors T21, T22, . . . , T2Y that are turned on. When at least one of the second, third and fourth voltage levels VL21, VL31 and VL41 are adjusted as described above, the voltage intervals and the voltage swing width may be adjusted.

The first pull-down circuit 44a may include a plurality of first pull-down transistors T31, . . . , T3X that are connected in parallel between the data I/O pad 450 and a ground voltage. The plurality of first pull-down transistors T31, . . . , T3X may be selectively turned on based on the first pull-down control signal PDS1. The second pull-down circuit 447*a* may include a plurality of second pull-down transistors T41, T42, . . . , T4Y that are connected in parallel between the data I/O pad 450 and the ground voltage. The plurality of second pull-down transistors T41, T42, . . . , T4Y may be selectively turned on based on the second pull-down control signal PDS2. Operations of the first and second pull-down circuits 445*a* and 447*a* may be similar to the operations of the first and second pull-up circuits 441*a* and 443*a*.

Figure 11A:
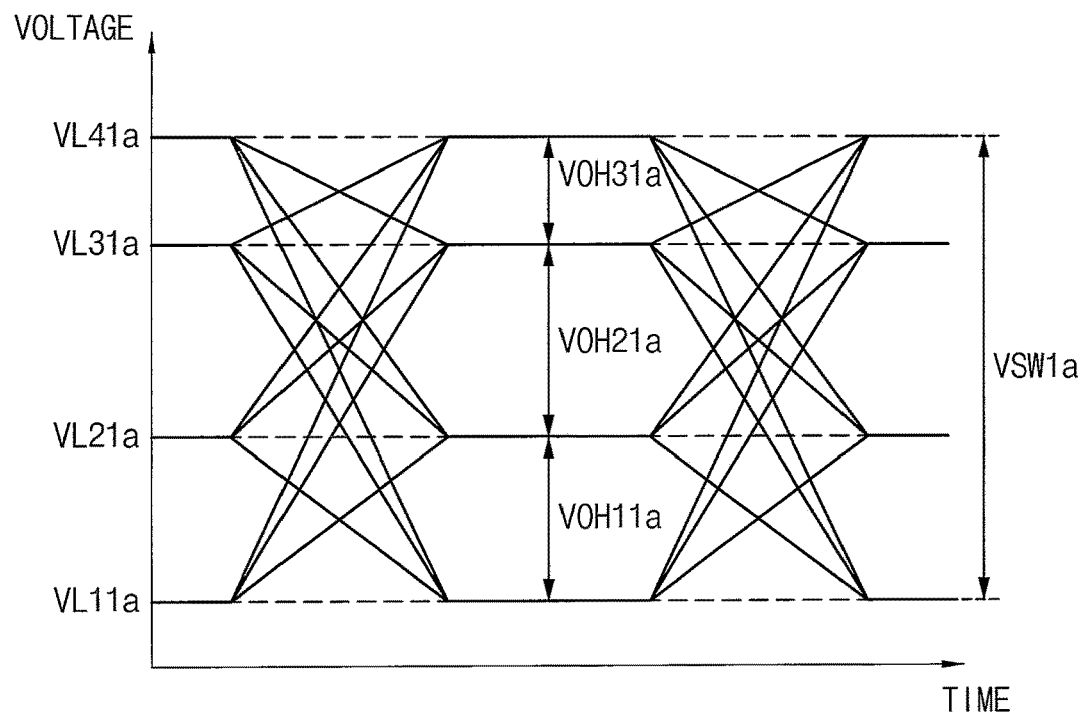
FIGS. 11A and 11B are diagrams for describing operations performed by a method of generating a multi-level signal and a transmitter according to example embodiments.
Figure 11B:
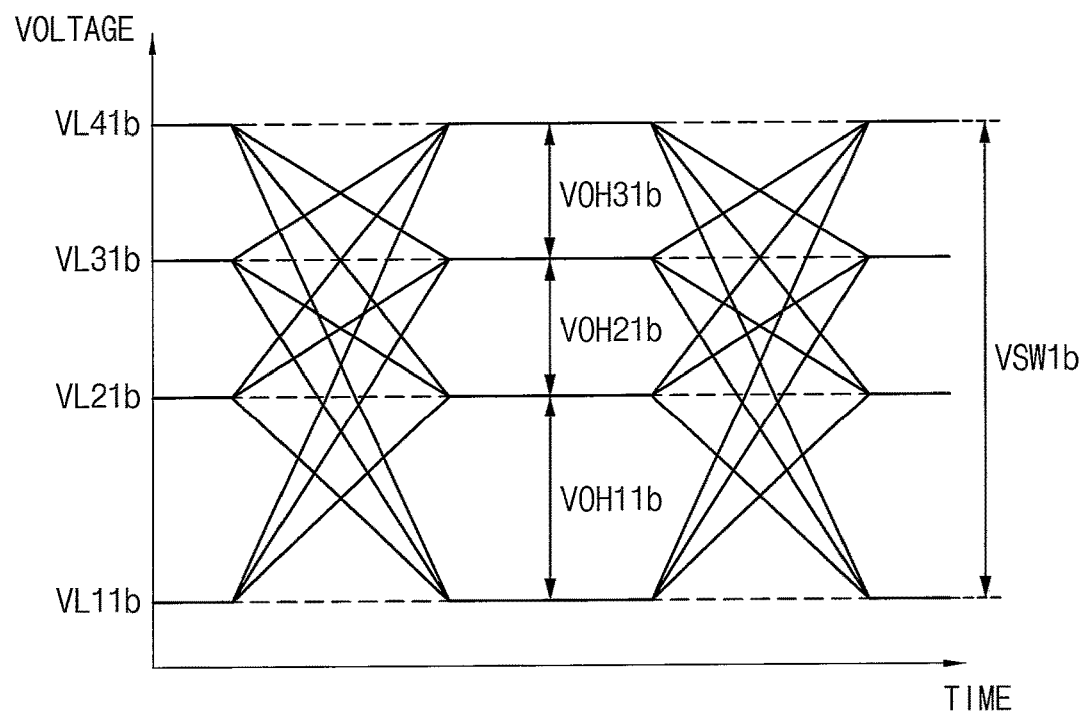

FIGS. 11A and 11B are diagrams for describing operations performed by a method of generating a multi-level signal and a transmitter according to example embodiments. Referring to FIG. 11A, as the voltage interval adjustment and the voltage swing width adjustment are performed on the output data signal, voltage levels VL11*a*, VL21*a*, VL31*a* and VL41*a* may be adjusted, and voltage intervals VOH11*a*, VOH21*a* and VOH31*a* and a voltage swing width VSW1*a* may be changed. As compared with the example of FIG. 6B, the first and second voltage intervals VOH11*a* and VOH21*a* and the voltage swing width VSW1*a* may increase in an example of FIG. 11A, and the third voltage interval VOH31*a* may decrease in the example of FIG. 11A. In addition, in the example of FIG. 9A, the first, second and third voltage intervals VOH11*a*, VOH21*a* and VOH31*a* may be different from each other, and the first voltage interval VOH11*a* may be less than the second voltage interval VOH21*a* and may be larger than the third voltage interval VOH31*a*.

Referring to FIG. 11B, as the voltage interval adjustment and the voltage swing width adjustment are performed on the output data signal, voltage levels VL11*b*, VL21*b*, VL31*b* and VL41*b* may be adjusted, and voltage intervals VOH11*b*, VOH21*b* and VOH31*b* and a voltage swing width VSW1*b* may be changed. As compared with the example of FIG. 7, the first voltage interval VOH11*b* and the voltage swing width VSW1*b* may increase in an example of FIG. 11B, and the second and third voltage intervals VOH21*b* and VOH31*b* may decrease in the example of FIG. 11B. In addition, in the example of FIG. 9B, the first voltage interval VOH11*b* may be larger than the second and third voltage intervals VOH21*b* and VOH31*b*, and the second and third voltage intervals VOH21*b* and VOH31*b* may be equal to each other.

Figure 12:
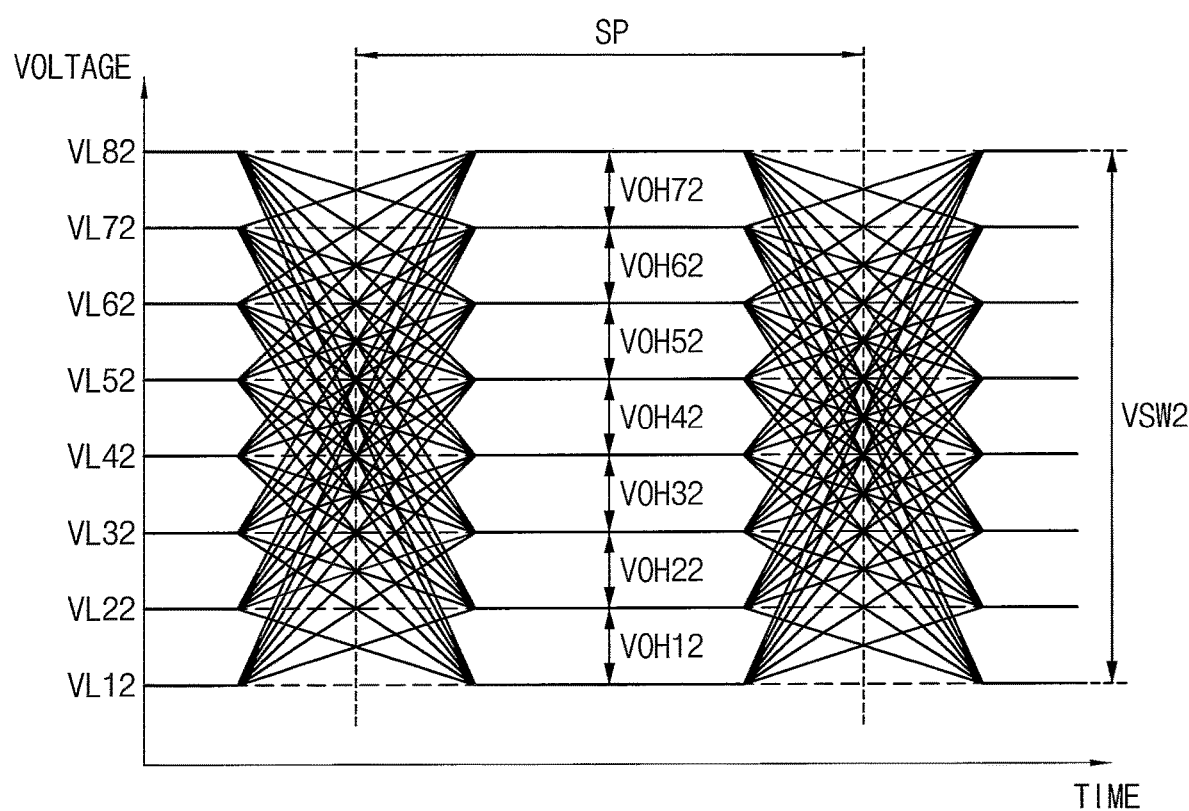
FIG. 12 is a diagram for describing a data signal generated by a method of generating a multi-level signal according to example embodiments.

FIG. 12 is a diagram for describing a data signal generated by a method of generating a multi-level signal according to example embodiments. The descriptions repeated with FIG. 7 will be omitted. Referring to FIG. 12: (i) different first, second, third, fourth, fifth, sixth, seventh and eighth voltage levels VL12, VL22, VL32, VL42, VL52, VL62, VL72 and VL82 of a data signal (e.g., a PAM8 signal) that is generated based on the 8-level scheme (e.g., the PAM8 scheme) are illustrated, (ii) different first, second, third, fourth, fifth, sixth and seventh voltage intervals VOH12, VOH22, VOH32, VOH42, VOH52, VOH62 and VOH72 of the data signal are illustrated, and (iii) a voltage swing width VSW2 of the data signal is illustrated. As described above, the selective level change for adjusting the voltage intervals and/or the voltage swing width may be performed.

Figure 13:
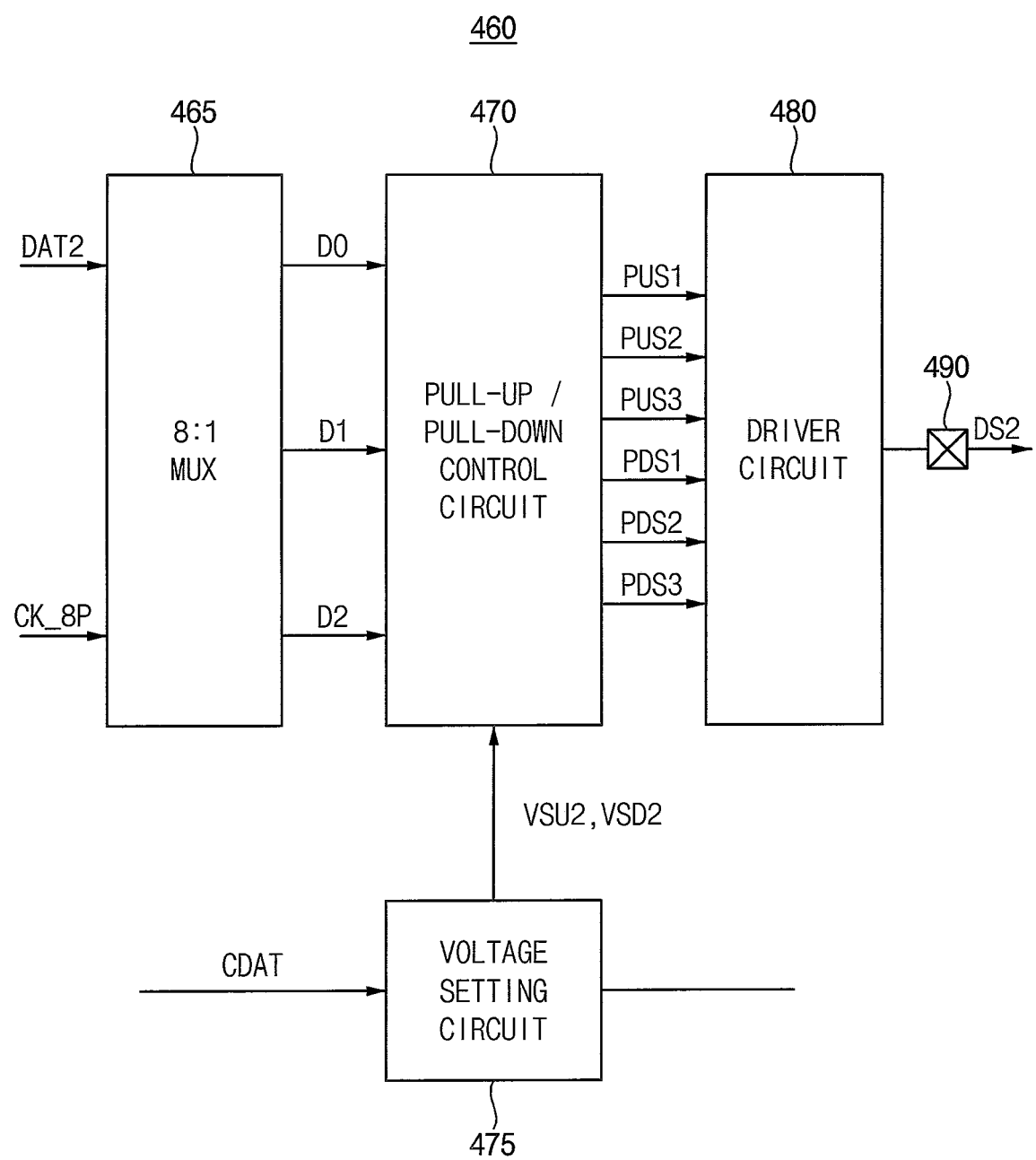
FIG. 13 is a block diagram illustrating a transmitter according to example embodiments.

FIG. 13 is a block diagram illustrating a transmitter according to example embodiments. The descriptions repeated with FIG. 8 will be omitted. Referring to FIG. 13, a transmitter 460 includes a pull-up/pull-down control circuit 470, a voltage setting circuit 475 and a driver circuit 480. The transmitter 460 may further include a multiplexer 465 and a data I/O pad 490, as shown.

In an example of FIG. 13, input data DAT2 may include a first bit D0, a second bit D1 and a third bit D2 that are different from each other, and the multiplexer 465 may divide the input data DAT2 into the first, second and third bits D0, D1 and D2 based on an eight-phase clock signal CK_8P. An output data signal DS2 may correspond to the data signal illustrated in FIG. 12, and may have one of the first, second, third, fourth, fifth, sixth, seventh and eighth voltage levels VL12, VL22, VL32, VL42, VL52, VL62, VL72 and VL82, that are different from each other, during one unit interval. The voltage setting operation may be performed by adjusting at least one of the voltage levels VL12, VL22, VL32, VL42, VL52, VL62, VL72 and VL82.

In some example embodiments, the first bit D0 may be a LSB of the input data DAT2, the second bit D1 may be a central significant bit (CSB) of the input data DAT2, and the third bit D2 may be an MSB of the input data DAT2. Based on the characteristic data CDAT, the voltage setting circuit 475 may generate the voltage setting control signals VSU2 and VSD2. The pull-up/pull-down control circuit 470 may generate pull-up control signals PUS1, PSU2, PUS3 and pull-down control signals PDS1, PDS2, PDS3 and may provide the pull-up control signals PUS1, PSU2, PUS3 and pull-down control signals PDS1, PDS2, PDS3 to the driver circuit 480.

Figure 14:
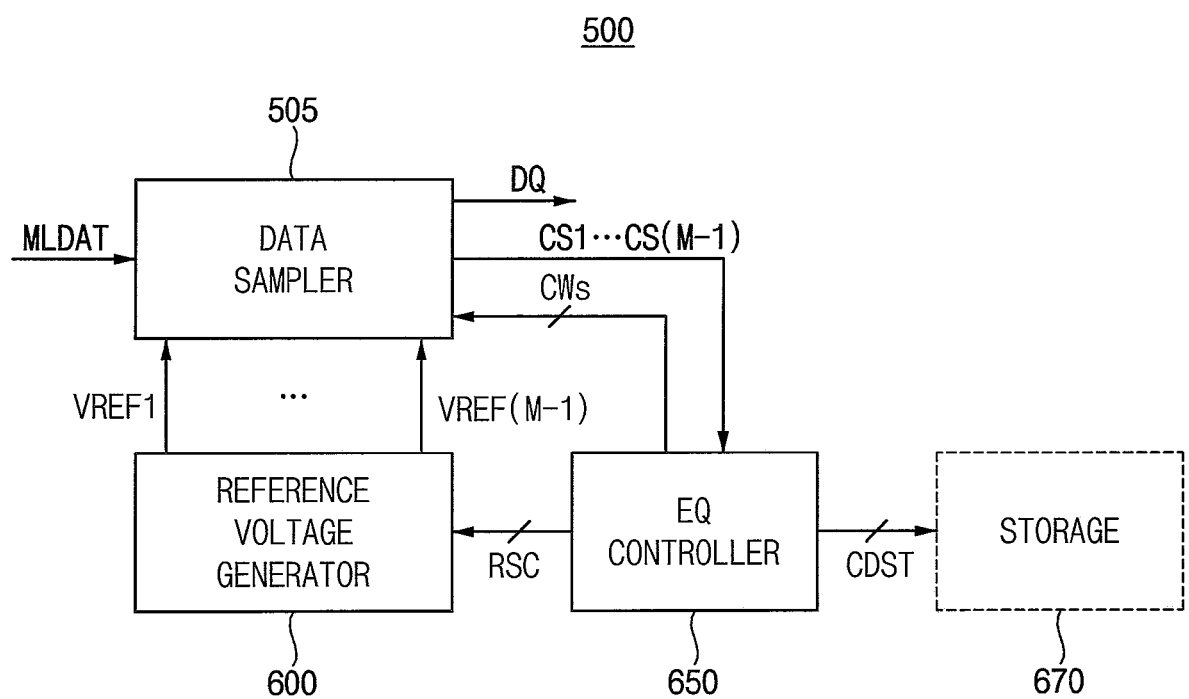
FIG. 14 is a block diagram illustrating a multi-level signal receiver according to example embodiments.

FIG. 14 is a block diagram illustrating a multi-level signal receiver according to example embodiments. Referring to FIG. 14, a multi-level signal receiver 500 may include a data sampler 505, a reference voltage generator 600, and an equalization controller 650. In FIG. 14, a storage device 670, which may be external to the multi-level signal receiver 500, is illustrated for convenience of explanation.

The data sampler 505 (i) receives a multi-level (data) signal MLDAT having one of M voltage levels different from each other, (ii) compares the multi-level signal MLDAT with (M−1) reference voltages VREF1~VREF (M−1), (iii) generates (M−1) comparison signals CS1~CS (M−1), and (iv) generates target data signal DQ including N bits based on the (M−1) comparison signals CS1~CS (M−1). Here, M is an integer greater than two and N is an integer greater than one. The data sampler 505 may include (M−1) sense amplifiers As shown, the reference voltage generator 600 may generate the (M−1) reference voltages VREF1~VREF (M−1) and may provide the (M−1) reference voltages VREF1~VREF (M−1) to the data sampler 505. In addition, the equalization controller 650 may train the (M−1) sense amplifiers by adjusting at least one of (M−1) voltage intervals when operating in a first training mode, and by adjusting levels of the (M−1) reference voltages VREF1~VREF (M−1) when operating in a second training mode, based on equalized values of the (M−1) comparison signals CS1~CS (M−1). Here, each of the (M−1) voltage intervals represents a difference between two adjacent voltage levels from among the M voltage levels. The equalization controller 650 may perform the training by providing control equalization coefficients CWs to equalizers within the data sampler 505. In addition, the equalization controller 650 may store control code set CDST associated with equalization coefficients of equalizers associated with the (M−1) sense amplifiers in the storage device 670 based on the training. The equalization controller 650 may also provide the reference voltage generator 600 with a reference switch control signal RSC to adjust levels of the (M−1) reference voltages VREF1~VREF (M−1).

Figure 15A:
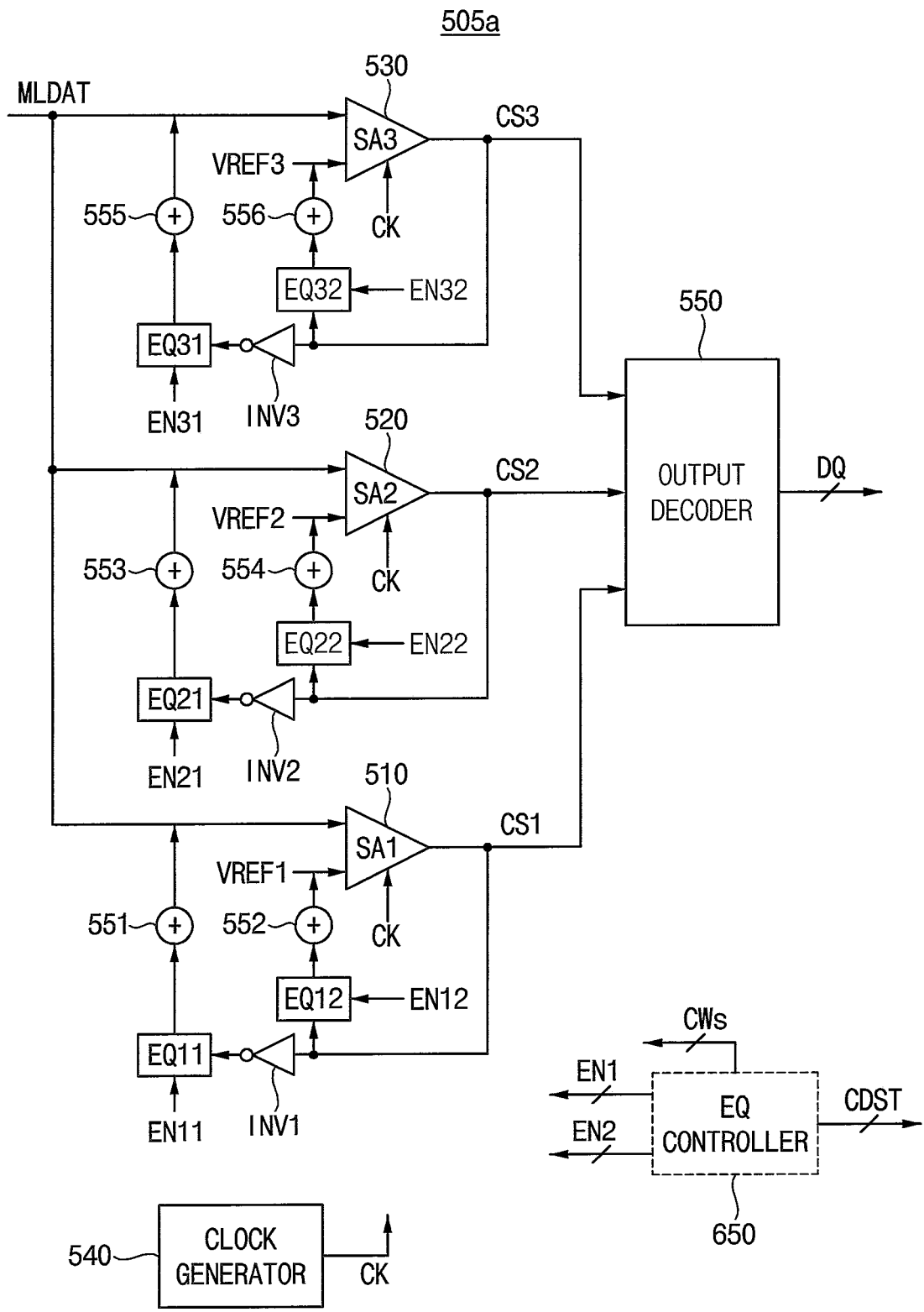
FIG. 15A is a block diagram illustrating an example of the data sampler in the multi-level signal receiver of FIG. 14 according to example embodiments.

FIG. 15A is a block diagram illustrating an example of the data sampler in the multi-level signal receiver of FIG. 14, according to example embodiments. In FIG. 15A, it is assumed that the value of M is four and the value of N is two. Referring to FIG. 15A, a data sampler 505a may include first through sense amplifiers 510, 520 and 530, a clock generator 540 and an output decoder 550. The data sampler 505a may further include first equalizers EQ11, EQ21 and EQ31, second equalizers EQ12, EQ22 and EQ32 and inverters INV1, INV2 and INV3.

The clock generator 540 generates the clock signal CK and provides the clock signal CK to the first through sense amplifiers 510, 520 and 530. In an embodiment, the clock generator 540 may generate the clock signal CK as a double data rate (DDR) clock signal, a four-phase clock signal, or an eight-phase clock signal.

The first sense amplifier 510 may compare the multi-level signal MLDAT received at a first input terminal with a first reference voltage VREF1 received at a second input terminal based on the clock signal CK, and output a first comparison signal CS1 to the output decoder 550. Similarly, the second sense amplifier 520 may compare the multi-level signal MLDAT received at a first input terminal with a second reference voltage VREF2 received at a second input terminal based on the clock signal CK, and output a second comparison signal CS2 to the output decoder 550. The third sense amplifier 530 may compare the multi-level signal MLDAT received at a first input terminal with a third reference voltage VREF3 received at a second input terminal based on the clock signal CK, and output a third comparison signal CS3 to the output decoder 550.

As shown by FIG. 15A, each of the first equalizers EQ11, EQ21 and EQ31 receive corresponding signals (i.e., "inverted" comparison signals) from the output terminals of respective inverters INV1, INV2 and INV3, and are also responsive to respective first enable signals EN11, EN21 and EN31, which operate to enable/disable the respective equalizer. Furthermore, each of the first equalizers EQ11, EQ21 and EQ31 generate respective first equalized values (at outputs thereof) by equalizing respective ones of the "inverted" comparison signals (i.e., /CS1, /CS2 and /CS3) generated by the inverters INV1, INV2 and INV3. In addition, each of the adders 551, 553 and 555 may pass a corresponding output from the first equalizers EQ11, EQ21 and EQ31 to a corresponding first input terminal of the first through third sense amplifiers 510, 520 and 530 (i.e., SA1, SA2, SA3).

Moreover, each of the second equalizers EQ12, EQ22 and EQ32 receive corresponding comparison signals (i.e., CS1, CS2 and CS3), and are also responsive to respective second enable signals EN12, EN22 and EN32, which operate to enable/disable the respective equalizer. Furthermore, each of the second equalizers EQ12, EQ22 and EQ32 generate respective second equalized values (at outputs thereof) by equalizing respective ones of the comparison signals (i.e., CS1, CS2 and CS3) and passing these equalized values to the adders 552, 554 and 556, which pass these signals to a corresponding second input terminal of the first through third sense amplifiers 510, 520 and 530.

The equalization controller 650 may provide the first enable signals EN11, EN21 and EN31 to the first equalizers EQ11, EQ21 and EQ31, may provide the second enable signals EN12, EN22 and EN32 to the second equalizers EQ12, EQ22 and EQ32, and may provide the first equalizers EQ11, EQ21 and EQ31 and the second equalizers EQ12, EQ22 and EQ32 with the control equalization coefficients CWs to control the first equalizers EQ11, EQ21 and EQ31 and the second equalizers EQ12, EQ22 and EQ32. Advantageously, the equalization controller 650 may adjust the control equalization coefficients CWs until the first through third comparison signals CS1, CS2 and CS3 match expected values, and may store control equalization coefficients CWs, in the storage 670, in case when the first through third comparison signals CS1, CS2 and CS3 match the expected values. The equalization controller 650 may store the expected values therein.

As described herein, when M corresponds to four, the multi-level signal MLDAT may have one of the first through fourth voltage levels VL11, VL21, VL31 and VL41, the first reference voltage VREF1 may be set to have a level between the first voltage level VL11 and the second voltage level VL21, the second reference voltage VREF2 may be set to have a level between the second voltage level VL21 and the third voltage level VL31, and the third reference voltage VREF3 may be set to have a level between the third voltage level VL31 and the fourth voltage level VL41. Accordingly, the second reference voltage VREF2 may have a voltage level greater than a voltage level of the first reference voltage VREF1 and the third reference voltage VREF3 may have a voltage level greater than the voltage level of the second reference voltage VREF2.

The output decoder 550 of FIG. 15A may decode the first comparison signal CS1, the second comparison signal CS2, and the third comparison signal CS3, and may determine data bits corresponding to the multi-level signal MLDAT based on levels of the first comparison signal CS1, the second comparison signal CS2, and the third comparison signal CS3, and may output the target data signal DQ indicating the determined data bits. For example, when the first comparison signal CS1, the second comparison signal CS2 and the third comparison signal CS3 indicate that a voltage level of the multi-level signal MLDAT is greater than the third reference voltage VREF3, the output decoder 550 may output the target data signal DQ corresponding '11'. Alternatively, when the first comparison signal CS1, the second comparison signal CS2 and the third comparison signal CS3 indicate that the voltage level of the multi-level signal MLDAT is smaller than the third reference voltage VREF3 and greater than the second reference voltage VREF2, the output decoder 550 may output the target data signal DQ corresponding to '10'.

And, when the first comparison signal CS1, the second comparison signal CS2 and the third comparison signal CS3 indicate that the voltage level of the multi-level signal MLDAT is smaller than the second reference voltage VREF2 yet greater than the first reference voltage VREF1, the output decoder 550 may output the target data signal DQ corresponding to '01'. Finally, when the first comparison signal CS1, the second comparison signal CS2 and the third comparison signal CS3 indicate that the voltage level of the multi-level signal MLDAT is smaller than the first reference voltage VREF1, the output decoder 550 may output the target data signal DQ corresponding to '00'.

Figure 15B:
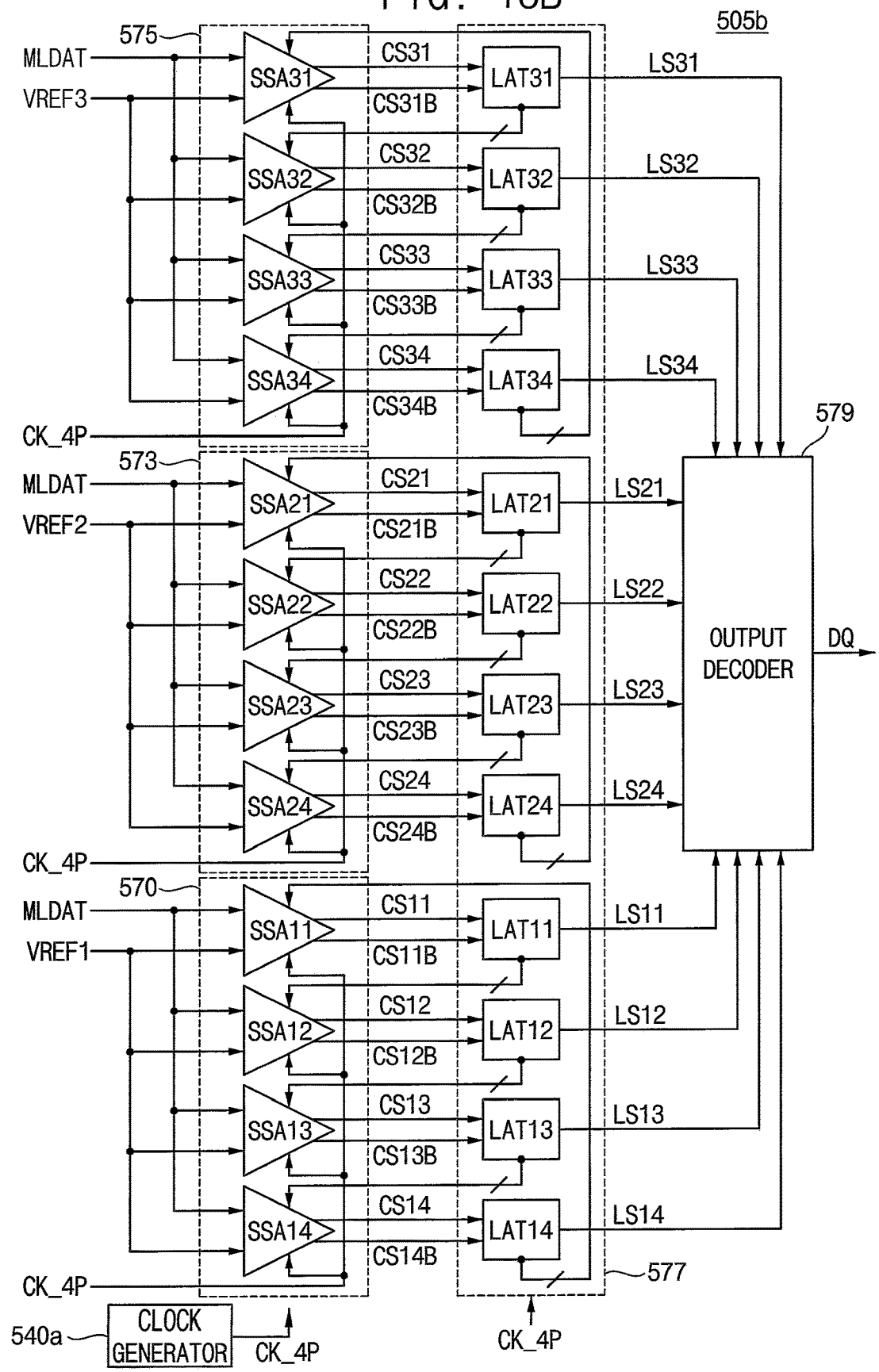
FIG. 15B is a block diagram illustrating another example of the data sampler in the multi-level signal receiver of FIG. 14 according to example embodiments.

FIG. 15B is a block diagram illustrating another example of the data sampler in the multi-level signal receiver of FIG. 14 according to example embodiments. In FIG. 15B, it is assumed that M is four (4) and N is two (2). Referring to FIG. 15B, a data sampler 505b may include first through third sense amplifiers 570, 573 and 575, a clock generator 540a, a latch circuit 577 and an output decoder 579. The clock generator 540a may generate a four-phase clock signal CK_4P and provide the clock signal CK_4P to the first through third sense amplifiers 570, 573, and 575 and the latch circuit 577.

The first sense amplifier 570 may include first through fourth sub sense amplifier SSA11~SSA14, the second sense amplifier 573 may include first through fourth sub sense amplifier SSA21~SSA24, and the third sense amplifier 575 may include first through fourth sub sense amplifier SSA31~SSA34. The latch circuit 577 may include latches LAT11~LAT14 corresponding to the first through fourth sub sense amplifiers SSA11~SSA14, latches LAT21~LAT24 corresponding to the first through fourth sub sense amplifiers SSA21~SSA24, and latches LAT31~LAT34 corresponding to the first through fourth sub sense amplifiers SSA31~SSA34.

Each of the first through fourth sub sense amplifiers SSA11~SSA14 may compare the multi-level signal MLDAT with the first reference voltage VREF1 at every phase of the four-phase clock signal CK_4P and may provide respective one of the latches LAT11~LAT14 with respective one of first comparison signals CS11~CS14 and respective one of first inverted comparison signals CS11B~CS14B based on a result of the comparison. Each of the latches LAT11~LAT14 may latch respective one of the first comparison signals CS11~CS14 and respective one of the first inverted comparison signals CS11B~CS14B to output respective one of latch signals LS11~LS14. Internal signals of the latches LAT11~LAT14 may correspond to a differential type and may fed-back to the first through fourth sub sense amplifiers SSA11~SSA14.

Similarly, each of the first through fourth sub sense amplifiers SSA21~SSA24 may compare the multi-level signal MLDAT with the second reference voltage VREF2 at every phase of the four-phase clock signal CK_4P and may provide respective one of the latches LAT21~LAT24 with respective one of second comparison signals CS21~CS24 and respective one of second inverted comparison signals CS21B~CS24B based on a result of the comparison. Each of the latches LAT21~LAT24 may latch respective one of the second comparison signals CS21~CS24 and respective one of the second inverted comparison signals CS21B~CS24B to output respective one of latch signals LS21~LS24. Internal signals of the latches LAT21~LAT24 may correspond to a differential type and may fed-back to the first through fourth sub sense amplifiers SSA21~SSA24.

Next, each of the first through fourth sub sense amplifiers SSA31~SSA34 may compare the multi-level signal MLDAT with the third reference voltage VREF3 at every phase of the four-phase clock signal CK_4P and may provide respective one of the latches LAT31~LAT34 with respective one of third comparison signals CS31~CS34 and respective one of third inverted comparison signals CS31B~CS34B based on a result of the comparison. Each of the latches LAT31~LAT34 may latch respective one of the third comparison signals CS31~CS34 and respective one of the third inverted comparison signals CS31B~CS34B to output respective one of latch signals LS31~LS34. Internal signals of the latches LAT31~LAT34 may correspond to a differential type and may fed-back to the first through fourth sub sense amplifiers SSA31~SSA34. The output decoder 595 may decode the latch signals LS11~LS14, the latch signals LS21~LS24, and the latch signals LS31~LS34 to output the target data signal DQ indicating the determined data bits.

Figure 16:
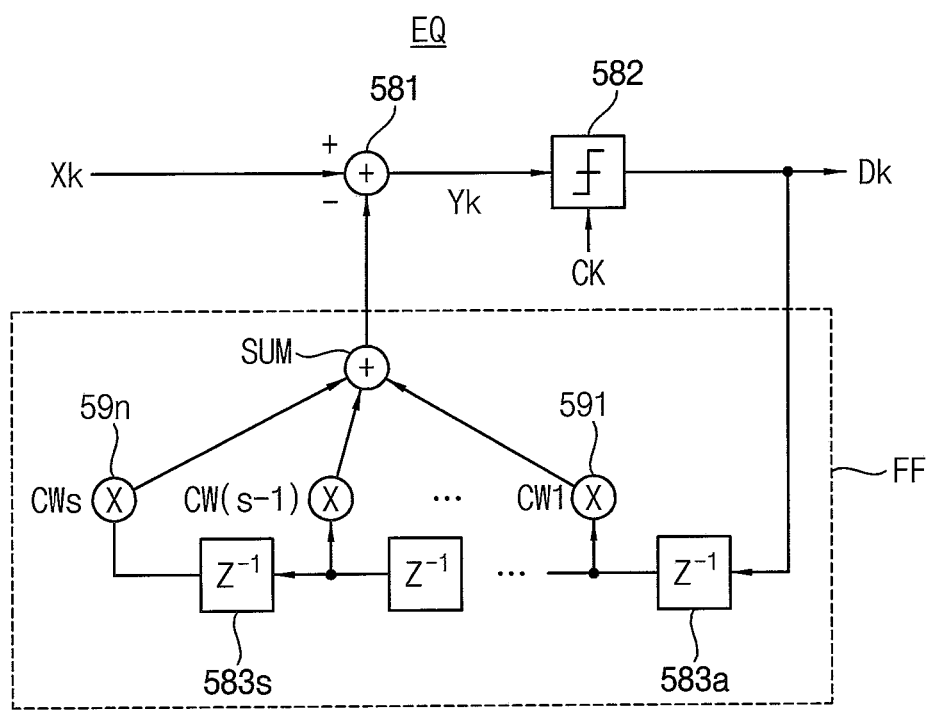
FIG. 16 is a circuit diagram illustrating one of equalizers in FIG. 14 according to example embodiments.

FIG. 16 is a circuit diagram illustrating one of equalizers in FIG. 14 (and FIG. 15A) according to example embodiments. Referring to FIG. 16, an equalizer EQ may be implemented with a decision feedback equalizer (DEF) and the equalizer EQ may include delay elements $583a$~$583s$, multipliers $591$~$59n$, an adder SUM, a subtractor 581 and a decision logic 582. Here, s is an integer greater than two and n is an integer greater than two. The delay elements $583a$~$583s$, the multipliers $591$~$59n$, and the adder SUM may constitute a feedback filter FF.

The delay elements $583a$~$583s$ may sequentially delay a decision bit Dk, the multipliers $591$~$59n$ multiply outputs of the delay elements $583a$~$583s$ by the control equalization coefficients CW1~CWs, respectively, the adder SUM adds outputs of the multipliers $591$~$59n$ and the subtractor 581 subtracts an output of the adder SUM from an input bit Xk to provide an output bit Yk. The decision logic 582 may determines a logic level of the output bit Yk based on the clock signal CLK to provide a decision bit Dk. In FIG. 16, the input bit Xk may one of the first through third comparison signals CS1, CS2 and CS3, or may be one of the inverted versions of the first through third comparison signals CS1, CS2 and CS3, and the decision bit Dk may correspond to one of an output of the first equalizers EQ11, EQ21 and EQ31, or an output of the second equalizers EQ12, EQ22 and EQ32.

Figure 17:
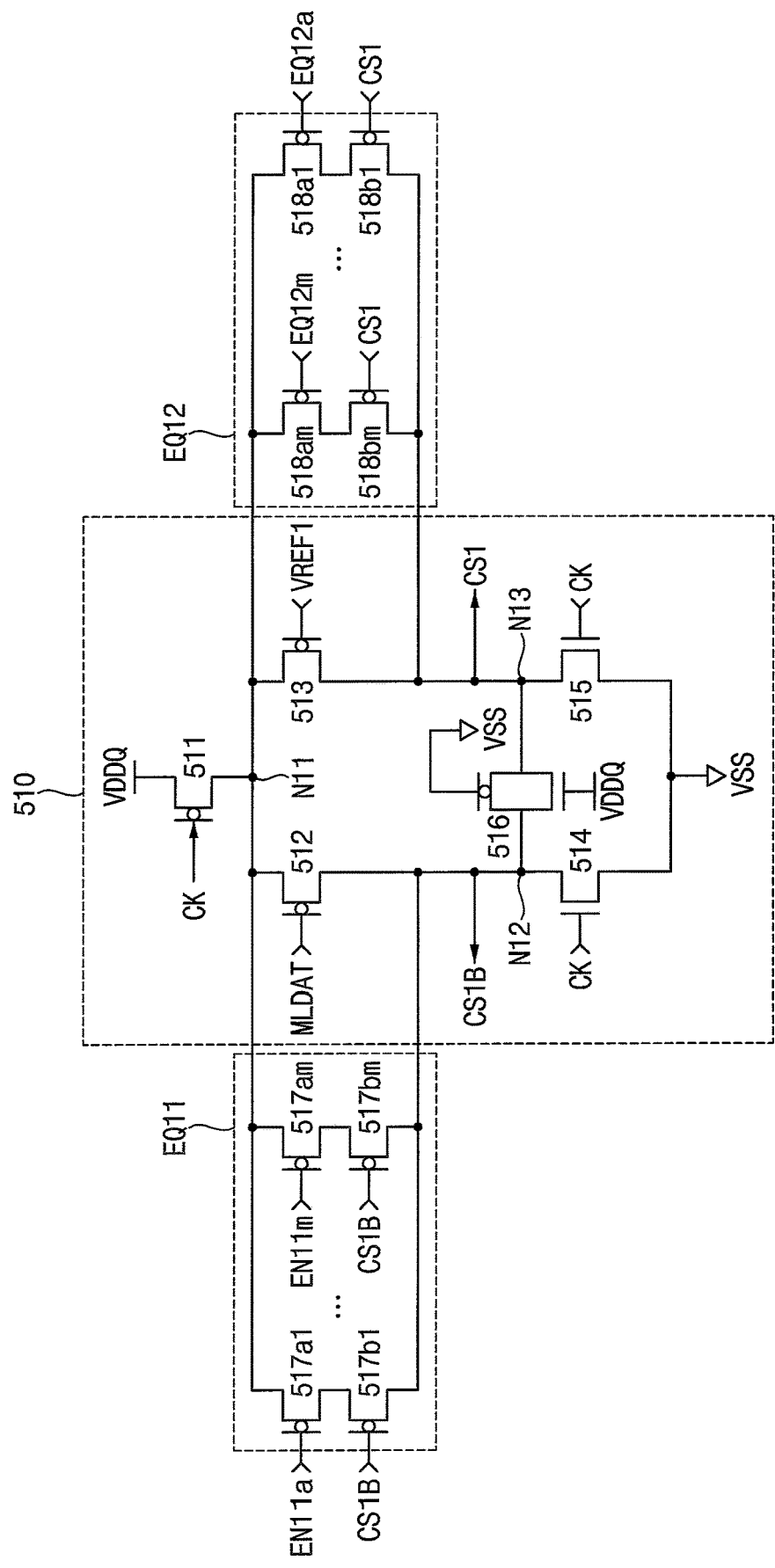
FIG. 17 is a circuit diagram illustrating an example of the first sense amplifier according to example embodiments.

FIG. 17 is a circuit diagram illustrating an example of the first sense amplifier according to example embodiments. In FIG. 17, the first equalizer EQ11 and the second equalizer EQ12 are illustrated for convenience of explanation. Referring to FIG. 17, the first sense amplifier 510 may include first through third p-channel metal-oxide semiconductor (PMOS) transistors 511, 512 and 513, a CMOS transmission gate 516 and first and second n-channel metal-oxide semiconductor (NMOS) transistors 514 and 515.

As shown, the first PMOS transistor 511 is connected between the power supply voltage VDDQ and a first node N11 and has a gate receiving the clock signal CK. The second default PMOS transistor 512 is connected between the first node N11 and a second node N12 and has a gate receiving the multi-level signal MLDAT. The third default PMOS transistor 513 is connected between the first node N11 and a third node N13 and has a gate receiving the first reference voltage VREF1.

The CMOS transmission gate 516 is connected between the second node N12 and the third node N13, and has gate terminals connected to the ground voltage VSS and the power supply voltage VDDQ, as shown, to thereby act as a normally-on transmission gate (having a predetermined channel resistance therein). The first default NMOS transistor 514 is connected between the second node N12 and the ground voltage VSS and has a gate receiving the clock signal CK. The second default NMOS transistor 515 is connected between the third node N13 and the ground voltage VDDQ and has a gate receiving the clock signal CK.

When the first PMOS transistor 511 is turned-on in response to the clock signal CK (i.e., CK=low), the first NMOS transistor 514 and the second NMOS transistor 515 are turned-off. Therefore, currents corresponding to voltage difference between the multi-level signal MLDAT and the first reference voltage VREF1 are provided to the second node N12 and the third node N13, respectively. The transmission gate 516 is turned-on, the first sense amplifier 510 may provide the first comparison single CS1 based on potential difference between the second node N12 and the third node N13. In contrast, when the first NMOS transistor 514 and the second NMOS transistor 515 are turned-on in response to the clock signal CK (i.e., CK=high), the second node N12 and the third node N13 are discharged to the ground voltage VSS. Therefore, the first sense amplifier 510 may compare the multi-level signal MLDAT and the first reference voltage VREF1, may output the first comparison single CS1 at the third node N13 and may output a first inverted comparison single CS1B at the second node N12.

The first equalizer EQ11 may include PMOS transistor pairs (517a1, 517b1)~(517am, 517bm) connected in parallel with the second PMOS transistor 512 between the first node N11 and the second node N12. Each pair of the PMOS transistor pairs (517a1, 517b1)~(517am, 517bm) may be connected in series between the first node N11 and the second node N12. Each gate of the PMOS transistors 517a1~517am receives respective one of first enable signals EN11a~EN11m, and each gate of the PMOS transistors 517b1~517bm receives inverted version CS1B of the first comparison signal CS1. At least some of the PMOS transistors 517a1~517am may have different channel width over channel length and at least some of the PMOS transistors 517b1~517bm may have different channel width over channel length.

Likewise, the second equalizer EQ12 may include PMOS transistor pairs (518a1, 518b1)~(518am, 518bm) connected in parallel with the third PMOS transistor 513 between the first node N11 and the third node N13. Each pair of the PMOS transistor pairs (518a1, 518b1)~(518am, 518bm) may be selectively connected in series between the first node N11 and the third node N13. Each gate of the PMOS transistors 518a1~518am receives a respective one of second enable signals EN12a~EN12m, and each gate of the PMOS transistors 518b1~518bm receives the first comparison signal CS1. At least some of the PMOS transistors 518a1~518am may have different channel width over channel length and at least some of the PMOS transistors 518b1~518bm may have different channel width over channel length.

Figure 18:
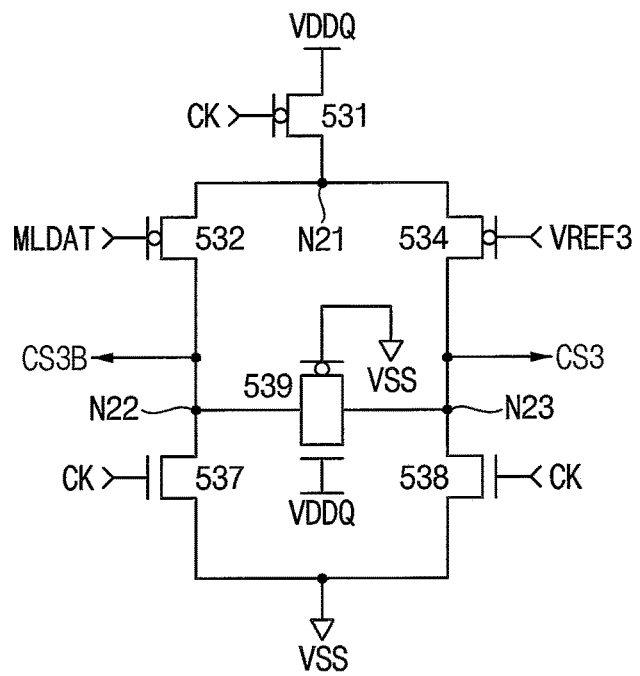
FIG. 18 is a circuit diagram illustrating an example of the third sense amplifier according to example embodiments.

FIG. 18 is a circuit diagram illustrating an example of the third sense amplifier according to example embodiments. Referring to FIG. 18, a third sense amplifier 530a may include first through third PMOS transistors 531, 532 and 534, a "normally-on" CMOS transmission gate 539 having a predetermined channel resistance ($R_{chan}$) and first and second NMOS transistors 537 and 538. The first PMOS transistor 531 is connected between the power supply voltage VDDQ and a first node N21, and has a gate receiving the clock signal CK. The second PMOS transistor 532 is connected between the first node N21 and a second node N22 and has a gate receiving the multi-level signal MLDAT. The third PMOS transistor 534 is connected between the first node N21 and a third node N23 and has a gate receiving the third reference voltage VREF3.

The transmission gate 539 is connected between the second node N22 and the third node N23, and is connected to the ground voltage VSS and the power supply voltage VDDQ. The first NMOS transistor 537 is connected between the second node N22 and the ground voltage VSS and has a gate receiving the clock signal CK. The second NMOS transistor 538 is connected between the third node N23 and the ground voltage VDDQ and has a gate receiving the clock signal CK. Therefore, the third sense amplifier 530a may compare the multi-level signal MLDAT and the third reference voltage VREF3, may output the third comparison single CS3 at the third node N23 and may output a third inverted comparison single CS3B at the second node N22.

As described with reference to FIG. 17, a first equalizer may be connected between the first node N21 and the second node N22 and a second equalizer may be connected between the first node N21 and the third node N23. In the embodiments, each threshold voltage of the second PMOS transistor 532 and the third PMOS transistor 534 is smaller than each threshold voltage of the second PMOS transistor 512 and the third PMOS transistor 513. Therefore, the first sense amplifier 510 and the third sense amplifier 530a may have a first sensing characteristic and the second sensing characteristic with respect to the first reference voltage VREF1 and the third reference voltage VREF3, respectively, based on a difference of the threshold voltages.

The third reference voltage VREF3 is applied to the gate of the third PMOS transistor 534, and the first reference voltage VREF1 whose level is smaller than a level of the third reference voltage VREF3 is applied to the gate of the third PMOS transistor 513. If the threshold voltages of the third PMOS transistor 534 and the third PMOS transistor 513 are the same, the second sensing characteristic of the third sense amplifier 530a may be worse than the first sensing characteristic of the first sense amplifier 510. But, because the threshold voltage of the third PMOS transistor 534 is smaller than the threshold voltage of the third PMOS transistor 513, the third PMOS transistor 534 is turned-on in response to a voltage level which is greater than a voltage level which turns-on the third PMOS transistor 513, so that the second sensing characteristic of the third sense amplifier 530a may be enhanced.

Figure 19:
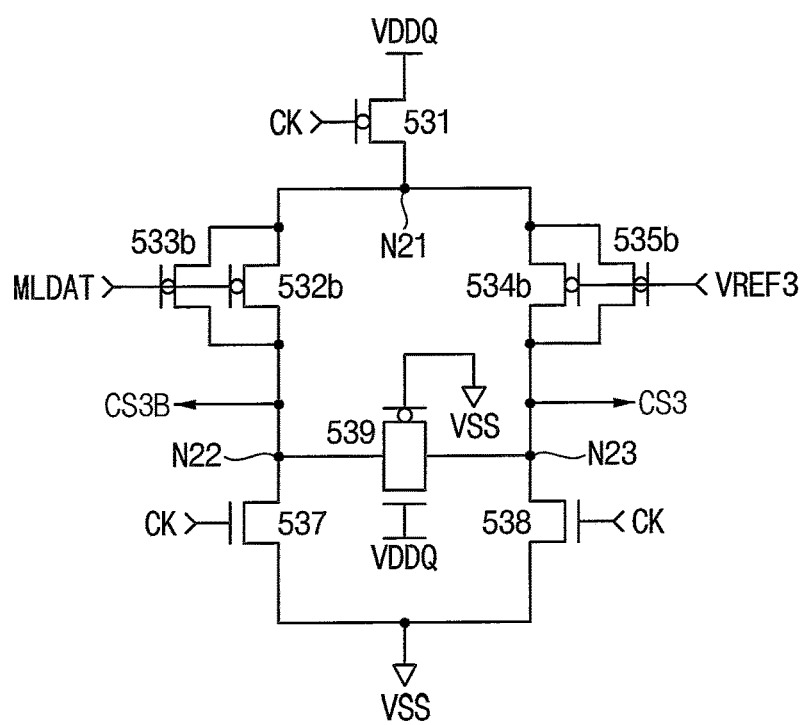
FIG. 19 is a circuit diagram illustrating an example of the third sense amplifier according to example embodiments.

FIG. 19 is a circuit diagram illustrating an example of the third sense amplifier according to example embodiments. Referring to FIG. 19, a third sense amplifier 530b may include first through fifth PMOS transistors 531, 532b, 533b and 534b, 535b, a transmission gate 539, and first and second NMOS transistors 537 and 538. The first PMOS transistor 531 is connected between the power supply voltage VDDQ and a first node N21 and has a gate receiving the clock signal CK. The second and third PMOS transistors 532b and 533b are connected in parallel between the first node N21 and a second node N22 and have gates receiving the multi-level signal MLDAT. The fourth and fifths PMOS transistors 534b and 535b are connected in parallel between the first node N21 and a third node N23 and have gates receiving the third reference voltage VREF3.

The CMOS transmission gate 539 (having a predetermined channel resistance $R_{chan}$) is connected between the second node N22 and the third node N23 and is connected to the ground voltage VSS and the power supply voltage VDDQ. The first NMOS transistor 537 is connected between the second node N22 and the ground voltage VSS and has a gate receiving the clock signal CK. The second NMOS transistor 538 is connected between the third node N23 and the ground voltage VSS and has a gate receiving the clock signal CK. Therefore, the third sense amplifier 530b may compare the multi-level signal MLDAT and the third reference voltage VREF3, may output the third comparison single CS3 at the third node N23, and may output the third inverted comparison single CS3B at the second node N22.

As described with reference to FIG. 17, a first equalizer may be connected between the first node N21 and the second node N22, and a second equalizer may be connected between the first node N21 and the third node N23. In the embodiments, each threshold voltage of the second through fifth PMOS transistors 531, 532b, 533b and 534b, 535b is smaller than each threshold voltage of the second PMOS transistor 512 and the third default PMOS transistor 513. Therefore, the first sense amplifier 510 and the third sense amplifier 530b have a first sensing characteristic and a second sensing characteristic with respect to the first reference voltage VREF1 and the third reference voltage VREF3, respectively, based on the differences of the threshold voltages.

In FIG. 19, the second and third PMOS transistors 532b and 533b receiving the multi-level signal MLDAT are disposed in parallel between the first node N21 and a second node N22 and the fourth and fifths PMOS transistors 534b and 535b receiving the third reference voltage VREF3 are disposed in parallel between the first node N21 and the third node N23. Therefore, a channel width over a channel length of a PMOS transistor receiving the third reference voltage VREF3 is increased.

Figure 20:
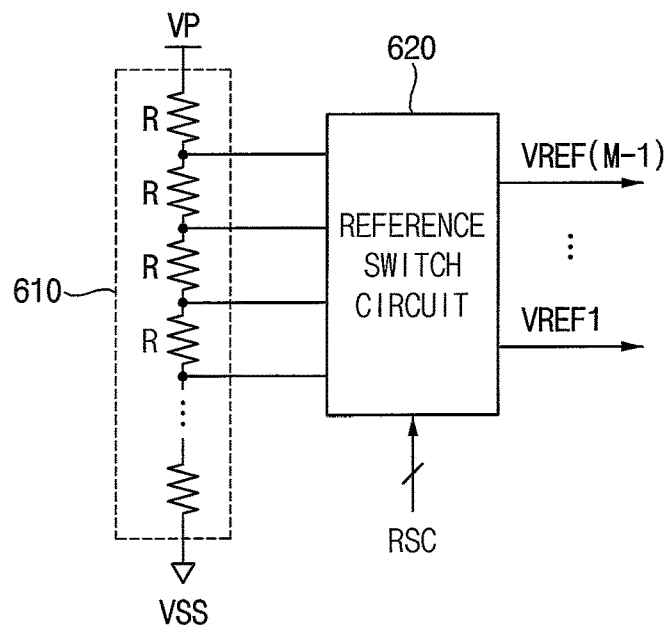
FIG. 20 is a block diagram illustrating an example of the reference voltage generator according to example embodiments.

FIG. 20 is a block diagram illustrating an example of the reference voltage generator according to example embodiments. Referring to FIG. 20, the reference voltage generator 600 may include a voltage division circuit 610 and a reference switch circuit 620. The voltage division circuit 610 may include a plurality of resistors R connected in series between the power supply voltage VDDQ and the ground voltage VSS. The reference switch circuit 620 may switch between the plurality of resistors R in response to the reference switch control signal RCS to output the (M−1) reference voltages VREF1~VREF (M−1). The reference switch circuit 620 may include a plurality of switches connected between the plurality of resistors R.

The reference switch control signal RCS may be provided from the equalization controller 650 in FIG. 14. Therefore, the equalization controller 650 may control the reference voltage generator 600 such that the levels of the (M−1) reference voltages are adjusted until the (M−1) comparison signals CS1~CS (M−1) match expected values, and may store control equalization coefficients CWs in the storage 670 when the (M−1) comparison signals CS1~CS (M−1) match the expected values. The equalization controller 650 may store the expected values therein.

Figure 21A:
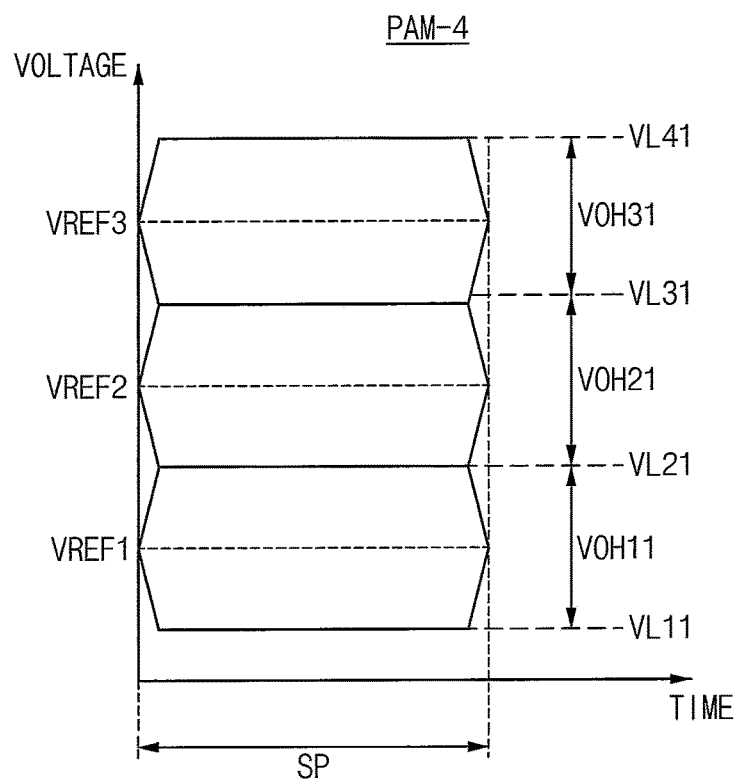
FIG. 21A illustrates the multi-level signal and the reference voltages when the multi-level signal is not affected by the channel.

FIG. 21A illustrates the multi-level signal and the reference voltages when the multi-level signal is not affected by the channel. Referring to FIG. 21A, the multi-level signal MLDAT denoted by PAM-4 may have one of the first through fourth voltage levels VL11, VL21, VL31 and VL41, the first reference voltage VREF1 may be set to have a level between the first voltage level VL11 and the second voltage level VL21, the second reference voltage VREF2 may be set to have a level between the second voltage level VL21 and the third voltage level VL31, and the third reference voltage VREF3 may be set to have a level between the third voltage level VL31 and the fourth voltage level VL41.

Figure 21B:
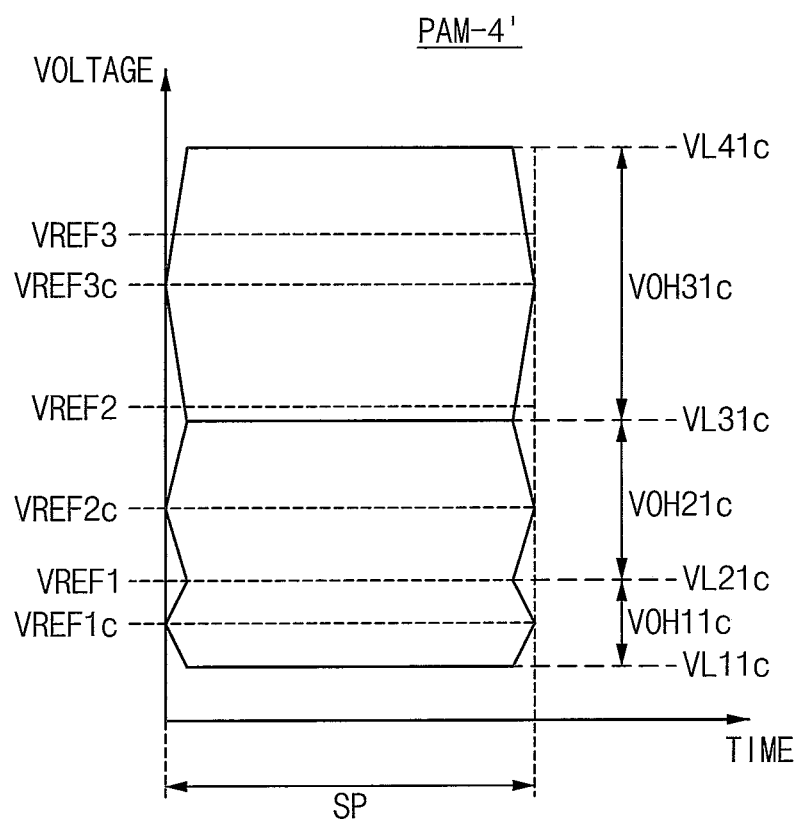
FIG. 21B illustrates the multi-level signal and the reference voltages when the multi-level signal is affected by the channel.

FIG. 21B illustrates the multi-level signal and the reference voltages when the multi-level signal is affected by the channel. Referring to FIG. 21B, the multi-level signal MLDAT denoted by PAM-4' may have one of the first through fourth voltage levels VL11c, VL21c, VL31c and VL41c different from each other, and the first, second and third voltage intervals VOH11c, VOH21c and VOH31c may be varied. By advantageously performing training according to example embodiments, the first through third reference voltages VREF1, VREF2 and VREF3 may be adjusted to first through third reference voltages VREF1c, VREF2c and VREF3c, and the first through third sense amplifiers 510, 520 and 530 may perform normal comparison operations responsive to the training.

FIG. 22 is a block diagram illustrating an example of a memory system of FIG. 1 according to example embodiments. The overlapping descriptions associated with FIGS. 2 and 3 will be omitted. Referring to FIG. 22, a memory system 11 includes a memory controller 101, a memory device 201 and a plurality of channels 31a, 31b and 31c. The memory system 11 may be substantially the same as the memory system 11 of FIG. 2, except that the memory device 201 further includes an eye monitor circuit 51a. The eye monitor circuit 51a may be coupled to the plurality of channels 31a, 31b and 31c, and may generate characteristic data CDAT1 that represents characteristics of the channels 31a, 31b and 31c based on the received output data signals DS11, DS21 and DS31. The control code set CDST stored in the storage 690 through the training may be provided to the equalizers in the receivers 47a, 47b and 47c as control codes CCDa, CCDb, . . . , CCDc.

A voltage setting circuit (e.g., the voltage setting circuit 430 in FIG. 8) is included in each of the transmitters 25a, 25b and 25c may generate voltage setting control signals based on the characteristic data CDAT1. Training including the voltage setting operation to adjust at least one of the voltage intervals based on the characteristics of the channels 31a, 31b and 31c. The eye monitor circuit 51a may be included with respect to each of the channels 31a, 31b and 31c or may be disposed at outside of the memory controller 101 and the memory device 201.

The training operation associated with FIGS. 21A-21B will be described in detail as follows. Before the training operation, all transmitters connected to each data I/O pad (or pin) may receive the same code for generating output signals to have the same voltage interval. After that, a command for starting the training operation may be received, and different random patterns may be output for each pin based on the "training" command. After that, "eyes" may be checked for each pin, and different codes may be provided for each pin and each voltage level. As the training operation is performed, output signals may be generated to have different voltage intervals for each pin. For example, a ZQ code may be changed in a case of on-resistance (or on-die) training, or an additional change circuit may be used to change the codes or voltage intervals. When the training operation is completed for each pin and for each level, signals received by the receivers may have optimal voltage intervals for each pin and for each level. In some example embodiments, the above-described training operation may be sequentially performed for each pin, or may be simultaneously (e.g., globally) performed for all pins.

Figure 23:
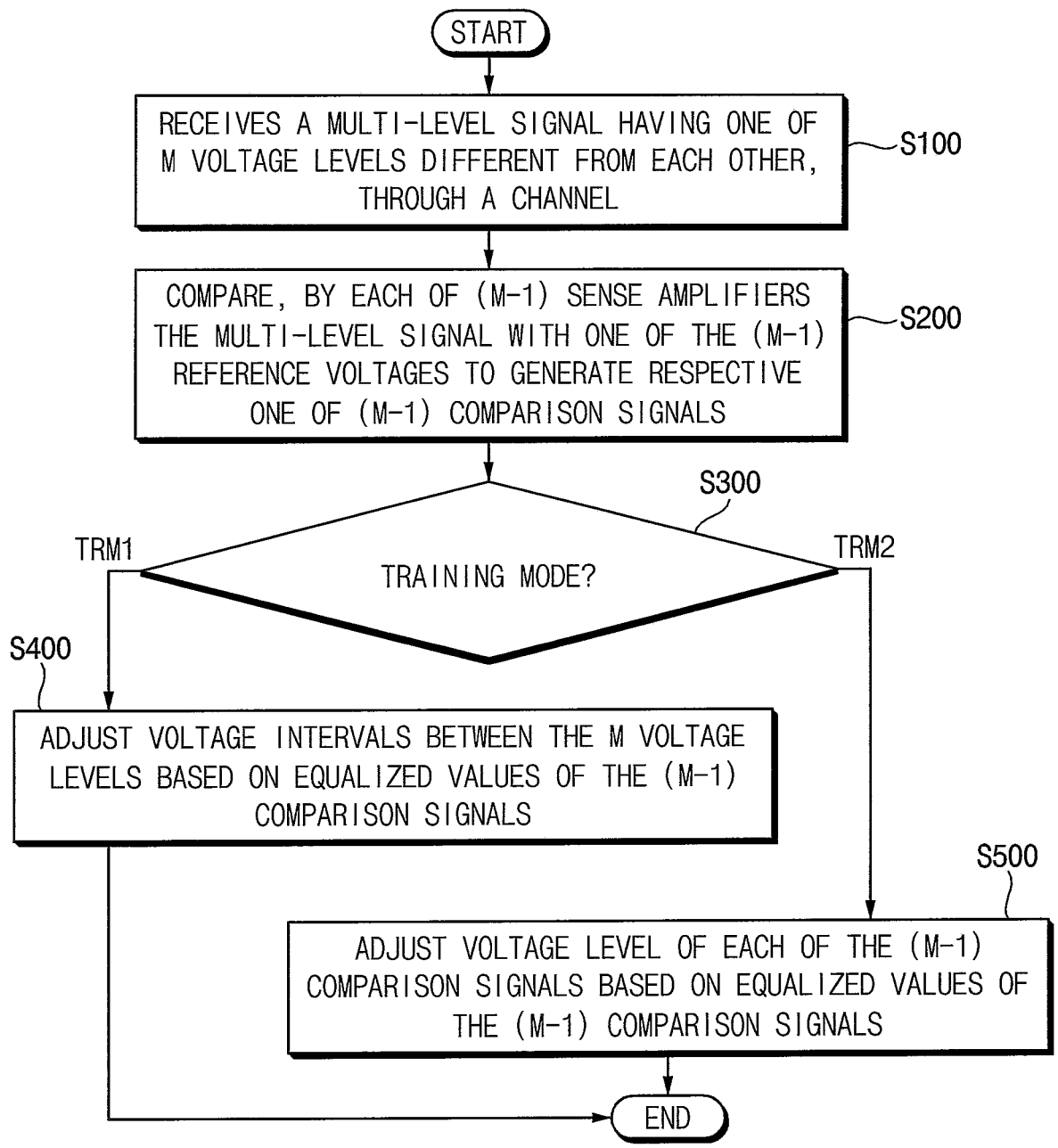
FIG. 23 is a flow chart illustrating a method of receiving a multi-level signal in the semiconductor memory device according to example embodiments.

FIG. 23 is a flow chart illustrating a method of receiving a multi-level signal in the semiconductor memory device according to example embodiments. Referring to FIGS. 1 through 23, in a method of receiving a multi-level signal in the semiconductor memory device, the multi-level signal receiver 500 in the semiconductor memory device 200 receives the multi-level signal MLDAT having one of M different voltage levels through a channel (operation S100). Here, M is an integer greater than two. Each of the (M−1) sense amplifiers in the multi-level signal receiver 500 compares a multi-level signal MLDAT with one of the (M−1) reference voltages to generate respective one of (M−1) comparison signals (operation S200). The equalization controller 650 in the receiver 500 determines whether a training mode corresponds to either a first training mode or a second training mode (operation S300).

When the training mode corresponds to the first training mode (TRM1 in S300), the equalization controller 650 may adjust at least one of (M−1) voltage intervals representing a difference between two adjacent voltage levels from among the M voltage levels based on equalized values of the (M−1) comparison signals CS1~CS (M−1) (operation S400). However, when the training mode corresponds to the second training mode (TRM2 in S300), the equalization controller 650 may adjust levels of the (M−1) reference voltages VREF1~VREF (M−1) based on the equalized values of the (M−1) comparison signals CS1~CS (M−1) (operation S500)

Figure 24:
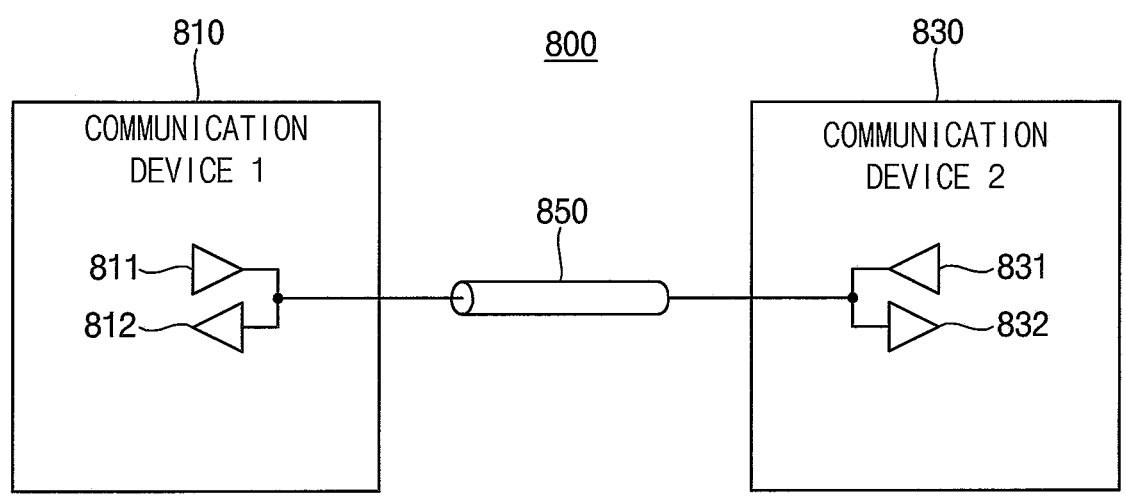
FIG. 24 is a block diagram illustrating a communication system according to example embodiments.

FIG. 24 is a block diagram illustrating a communication system according to example embodiments. Referring to FIG. 24, a communication system 800 includes a first communication device 810, a second communication device 830 and a channel 850 therebetween. The first communication device 810 includes a first transmitter 811 and a first receiver 812. The second communication device 830 includes a second transmitter 831 and a second receiver 832. The first transmitter 811 and the first receiver 812 are connected to the second transmitter 831 and the second receiver 832 through the channel 850. In some example embodiments, each of the first and second communication devices 810 and 830 may include a plurality of transmitters and a plurality of receivers, and the communication system 800 may include a plurality of channels for connecting the plurality of transmitters and a plurality of receivers.

In addition, the receivers 812 and 832 may be the multi-level signal receivers described herein with respect to example embodiments, may receive a multi-level signal having one of M voltage levels different from each other, may determine a voltage level of the multi-level signal by using M−1 sense amplifiers, and may perform training on the M−1 sense amplifiers per data I/O pad, as described hereinabove.

The inventive concept may be applied to various devices and systems that include the memory devices and the memory systems. For example, the inventive concept may be applied to systems such as a personal computer (PC), a server computer, a data center, a workstation, a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, etc.

The foregoing is illustrative of example embodiments and is not to be construed as limiting thereof. Although some example embodiments have been described, those skilled in the art will readily appreciate that many modifications are possible in the example embodiments without materially departing from the novel teachings and advantages of the example embodiments. Accordingly, all such modifications are intended to be included within the scope of the example embodiments as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A multi-level signal receiver, comprising:
    a data sampler including (M−1) sense amplifiers configured to compare a multi-level signal having one of M voltage levels with (M−1) reference voltages, to thereby generate (M−1) comparison signals, the data sampler configured to generate a target data signal including N bits, where M is an integer greater than two and N is an integer greater than one; and
    an equalization controller configured to train the (M−1) sense amplifiers by: (i) adjusting at least one of (M−1) voltage intervals during a first training mode, and (ii) adjusting levels of the (M−1) reference voltages during a second training mode, based on equalized values of the (M−1) comparison signals, where each of the (M−1) voltage intervals represents a difference between two adjacent voltage levels from among the M voltage levels.

2. The multi-level signal receiver of claim 1, wherein the M voltage levels include a first voltage level, a second voltage level greater than the first voltage level, a third voltage level greater than the second voltage level and a fourth voltage level greater than the third voltage level; wherein the (M−1) reference voltages include a first reference voltage, a second reference voltage greater than the first reference voltage, and a third reference voltage greater than the second reference voltage; and wherein the N bits include a first bit and a second bit.

3. The multi-level signal receiver of claim 2,
    wherein the M−1 sense amplifiers include:
        a first sense amplifier configured to compare the multi-level signal received at a first input terminal with the first reference voltage received at a second input terminal, and to output a first comparison signal at an output terminal, responsive to a clock signal;
        a second sense amplifier configured to compare the multi-level signal received at a first input terminal with the second reference voltage received at a second input terminal, and to output a second comparison signal at an output terminal, responsive to the clock signal; and
        a third sense amplifier configured to compare the multi-level signal received at a first input terminal with the third reference voltage received at a second input terminal, and to output a third comparison signal at an output terminal, responsive to the clock signal; and
    wherein the data sampler further includes:
        a clock generator configured to generate the clock signal; and
        an output decoder configured to decode the first comparison signal, the second comparison signal and the third comparison signal, and to output the target data signal.

4. The multi-level signal receiver of claim 3, further comprising:
    a first equalizer having an input responsive to an inverted version of the first comparison signal and an output electrically coupled to the first input terminal of the first sense amplifier; and
    a second equalizer having an input responsive to the first comparison signal and an output electrically coupled to the second input terminal of the first sense amplifier.

5. The multi-level signal receiver of claim 4, wherein the equalization controller is configured to enable the first equalizer during the first training mode; wherein the first equalizer is configured to provide the first input terminal of the first sense amplifier with an equalized version of the first comparison signal; and wherein the equalization controller is configured to adjust a first control equalization coefficient, which is provided as an input to the first equalizer during the first training mode.

6. The multi-level signal receiver of claim 5, wherein responsive to the first comparison signal matching a predetermined value, the equalization controller will store the adjusted first control equalization coefficient as a control code in a storage device.

7. The multi-level signal receiver of claim 5, wherein the equalization controller is configured to enable the second equalizer during the second training mode, and is further configured to control a reference voltage generator so that at least one of the (M−1) reference voltages is adjusted during the second training mode.

8. A multi-level signal receiver comprising:
a data sampler including (M−1) sense amplifiers configured to compare a multi-level signal having one of M voltage levels different from each other, received from a channel with (M−1) reference voltages to generate (M−1) comparison signals, the data sampler configured to generate a target data signal including N bits, M being an integer greater than two and N being an integer greater than one;
a reference voltage generator configured to generate the (M−1) reference voltages; and
an equalization controller configured to train the (M−1) sense amplifiers by adjusting at least one of (M−1) voltage intervals in a first training mode and by adjusting levels of the (M−1) reference voltages in second training mode, based on equalized values of the (M−1) comparison signals,
wherein each of the (M−1) voltage intervals represents a difference between two adjacent voltage levels from among the M voltage levels.

9. The multi-level signal receiver of claim 8, wherein:
the M voltage levels include a first voltage level, a second voltage level greater than the first voltage level, a third voltage level greater than the second voltage level and a fourth voltage level greater than the third voltage level;
the (M−1) reference voltages include a first reference voltage, a second reference voltage whose level is greater than a level of the first reference voltage and a third reference voltage whose level is greater the level of the second reference voltage; and
the N bits include a first bit and a second bit,
wherein the M−1 sense amplifiers includes:
a first sense amplifier configured to compare the multi-level signal received at a first input terminal with the first reference voltage received at a second input terminal to output a first comparison signal at an output terminal, based on a clock signal;
a second sense amplifier configured to compare the multi-level signal received at a first input terminal with the second reference voltage received at a second input terminal to output a second comparison signal at an output terminal, based on the clock signal; and
a third sense amplifier configured to compare the multi-level signal received at a first input terminal with the third reference voltage received at a second input terminal to output a third comparison signal at an output terminal, based on the clock signal, and
wherein the data sampler further includes:
a clock generator configured to generate the clock signal; and
an output decoder configured to decode the first comparison signal, the second comparison signal and the third comparison signal to output the target data signal, and
wherein the multi-level signal receiver further includes:
first equalizers, each of the first equalizers being connected between each of inverters connected to the output terminals and respective one of the first input terminals; and
second equalizers, each of the second equalizers being connected between each of the output terminals and respective one of the second input terminals.

10. The multi-level signal receiver of claim 9, wherein:
each of the first equalizers and each of the second equalizers include a decision feedback equalizer.

11. The multi-level signal receiver of claim 9, wherein:
the equalization controller is configured to enable the first equalizers in the first training mode,
each of the first equalizers is configured to provide the respective one of the first input terminals with respective one of first equalized values and respective one of the second equalized values, the first equalized values being obtained by equalizing the first comparison signal, the second comparison signal and the third comparison signal, and the second equalized values being obtained by equalizing inverted versions of the first comparison signal, the second comparison signal and the third comparison signal, and
the equalization controller is configured to adjust first control equalization coefficients of the first equalizers until the first comparison signal, the second comparison signal and the third comparison signal in response to the equalized values match expected values.

12. The multi-level signal receiver of claim 11, wherein the equalization controller is configured to transmit a signal to a memory controller that generates the multi-level signal such that the at least one of the (M−1) voltage intervals is adjusted until the first comparison signal, the second comparison signal and the third comparison signal in response to the equalized values match expected values.

13. The multi-level signal receiver of claim 11, wherein:
when first comparison signal, the second comparison signal and the third comparison signal in response to the equalized values match expected values, the equalization controller is configured to store the first control equalization coefficients of the first equalizers as a first control code set in a storage external to the multi-level signal receiver, and
wherein equalization controller is configured to transmit the first control code set to memory controller that generates the multi-level signal as a characteristic data.

14. The multi-level signal receiver of claim 9, wherein:
the equalization controller is configured to enable the second equalizers in the second training mode,
each of the first equalizers is configured to provide the respective one of the second input terminals with respective one of first equalized values and respective one of the second equalized values, the first equalized values being obtained by equalizing the first comparison signal, the second comparison signal and the third comparison signal, and the second equalized values being obtained by equalizing inverted versions of the first comparison signal, the second comparison signal and the third comparison signal,
the equalization controller is configured to control the reference voltage generator such that the levels of the (M−1) reference voltages are adjusted until the first comparison signal, the second comparison signal and the third comparison signal in response to the equalized values match expected values.

15. The multi-level signal receiver of claim 14, when the first comparison signal, the second comparison signal and the third comparison signal match expected values, the equalization controller is configured to store second control equalization coefficients of the second equalizers as a second control code set in a storage external to the multi-level signal receiver, and
wherein the equalization controller is configured to provide the reference voltage generator with a reference switch control signal based on the second control code set.

16. The multi-level signal receiver of claim 9, wherein the first sense amplifier includes:
- a first p-channel metal-oxide semiconductor (PMOS) transistor which is connected between the power supply voltage and a first node and has a gate receiving the clock signal;
- a second PMOS transistor which is connected between the first node and a second node and has a gate receiving the multi-level signal;
- a third PMOS transistor which is connected between the first node and a third node and has a gate receiving the third reference voltage;
- a transmission gate which is connected between the second node and the third node and is connected to the ground voltage and the power supply voltage;
- a first n-channel metal-oxide semiconductor (NMOS) transistor which is connected between the second node and the ground voltage and has a gate receiving the clock signal; and
- a second NMOS transistor which is connected between the third node and the ground voltage and has a gate receiving the clock signal, and
- wherein the first sense amplifier outputs the third comparison signal at the third node.

17. The multi-level signal receiver of claim 9, wherein the third sense amplifier includes:
- a first p-channel metal-oxide semiconductor (PMOS) transistor which is connected between the power supply voltage and a first node and has a gate receiving the clock signal;
- a second PMOS transistor which is connected between the first node and a second node and has a gate receiving the multi-level signal;
- a third PMOS transistor which is connected between the first node and a third node and has a gate receiving the third reference voltage;
- a transmission gate which is connected between the second node and the third node and is connected to the ground voltage and the power supply voltage;
- a first n-channel metal-oxide semiconductor (NMOS) transistor which is connected between the second node and the ground voltage and has a gate receiving the clock signal; and
- a second NMOS transistor which is connected between the third node and the ground voltage and has a gate receiving the clock signal, and
- wherein the third sense amplifier outputs the third comparison signal at the third node.

18. The multi-level signal receiver of claim 9, wherein the third sense amplifier includes:
- a first p-channel metal-oxide semiconductor (PMOS) transistor which is connected between the power supply voltage and a first node and has a gate receiving the clock signal;
- second and third PMOS transistors which are connected in parallel between the first node and a second node and have gates receiving the multi-level signal;
- fourth and fifth PMOS transistors which are connected in parallel between the first node and a third node and have gates receiving the third reference voltage;
- a transmission gate which is connected between the second node and the third node and is connected to the ground voltage and the power supply voltage;
- a first n-channel metal-oxide semiconductor (NMOS) transistor which is connected between the second node and the ground voltage and has a gate receiving the clock signal; and
- a second NMOS transistor which is connected between the third node and the ground voltage and has a gate receiving the clock signal, and
- wherein the third sense amplifier outputs the third comparison signal at the third node.

19. A memory system configured to transmit data based on a multi-level signal having one of M voltage levels different from each other, M being an integer greater than two, the memory system comprising:
- a memory controller including a transmitter configured to generate the multi-level signal based on input data; and
- a memory device connected to the memory controller through a channel, the memory device including at least one multi-level signal receiver configured to receive the multi-level signal from the channel and configured to compare the multi-level signal with (M−1) reference voltages to generate a target data signal including N bits, N being an integer greater than one,
- wherein the at least one multi-level signal receiver includes:
- a data sampler including (M−1) sense amplifiers configured to compare the multi-level signal with the (M−1) reference voltages to generate (M−1) comparison signals;
- a reference voltage generator configured to generate the (M−1) reference voltages; and
- an equalization controller configured to train the (M−1) sense amplifiers by adjusting at least one of (M−1) voltage intervals in a first training mode and by adjusting levels of the (M−1) reference voltages in second training mode, based on equalized values of the (M−1) comparison signals,
- wherein each of the (M−1) voltage intervals represents a difference between two adjacent voltage levels from among the M voltage levels.

20. The memory system of claim 19, wherein:
- the at least one multi-level signal receiver includes a plurality of multi-level signal receivers connected to a plurality of data input/output (I/O) pads connected to the memory controller through the channel;
- the semiconductor memory device is configured to perform the training on the plurality of multi-level signal receivers sequentially by unit of the I/O pad;
- the semiconductor memory device further includes a memory cell array including a plurality of nonvolatile memory cells coupled to a plurality of word-lines and a plurality of bit-lines, the memory cell array storing the target data signal; and
- each of the plurality of memory cells has a dynamic random access memory (DRAM) cell configuration.

* * * * *